US008085234B2

(12) United States Patent
Nishimura et al.

(10) Patent No.: US 8,085,234 B2
(45) Date of Patent: Dec. 27, 2011

(54) CAPACITIVE LOAD DRIVING CIRCUIT, METHOD OF DRIVING CAPACITIVE LOAD, METHOD OF DRIVING LIQUID CRYSTAL DISPLAY DEVICE

(75) Inventors: Kouichi Nishimura, Kanagawa (JP); Takashi Nose, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 1054 days.

(21) Appl. No.: 11/984,036

(22) Filed: Nov. 13, 2007

(65) Prior Publication Data
US 2008/0129718 A1  Jun. 5, 2008

(30) Foreign Application Priority Data
Dec. 4, 2006  (JP) .................... 2006-327352

(51) Int. Cl.
G09G 3/36  (2006.01)
(52) U.S. Cl. ......................................... 345/100
(58) Field of Classification Search .................. 345/100, 345/87, 92, 95, 98
See application file for complete search history.

(56) References Cited

U.S. PATENT DOCUMENTS

| 6,331,844 | B1 * | 12/2001 | Okumura et al. ............... 345/87 |
| 6,624,669 | B1 | 9/2003 | Tsuchi |
| 6,900,796 | B2 * | 5/2005 | Yasunishi et al. ............. 345/204 |
| 2005/0017941 | A1 * | 1/2005 | Simon et al. .................... 345/98 |
| 2006/0125759 | A1 * | 6/2006 | An .................................. 345/98 |
| 2006/0244710 | A1 * | 11/2006 | Iriguchi et al. ............... 345/100 |
| 2007/0008009 | A1 * | 1/2007 | Son et al. ........................ 326/87 |

FOREIGN PATENT DOCUMENTS
JP  2000-338461  12/2000

* cited by examiner

*Primary Examiner* — Chanh Nguyen
*Assistant Examiner* — Roy Rabindranath
(74) *Attorney, Agent, or Firm* — McGinn Intellectual Property Law Group, PLLC

(57) ABSTRACT

A capacitive load driving circuit includes a gate driver, and a source driver. The gate driver drives a plurality of capacitive loads arranged in a matrix form in a row direction. The source driver drives the plurality of capacitive loads in a column direction. The source driver includes a plurality of output circuits configured to be arranged in a row direction. Each of the plurality of output circuits changes a slew rate based on a column position of a capacitive load of the plurality of capacitive loads driven by the gate driver.

6 Claims, 21 Drawing Sheets

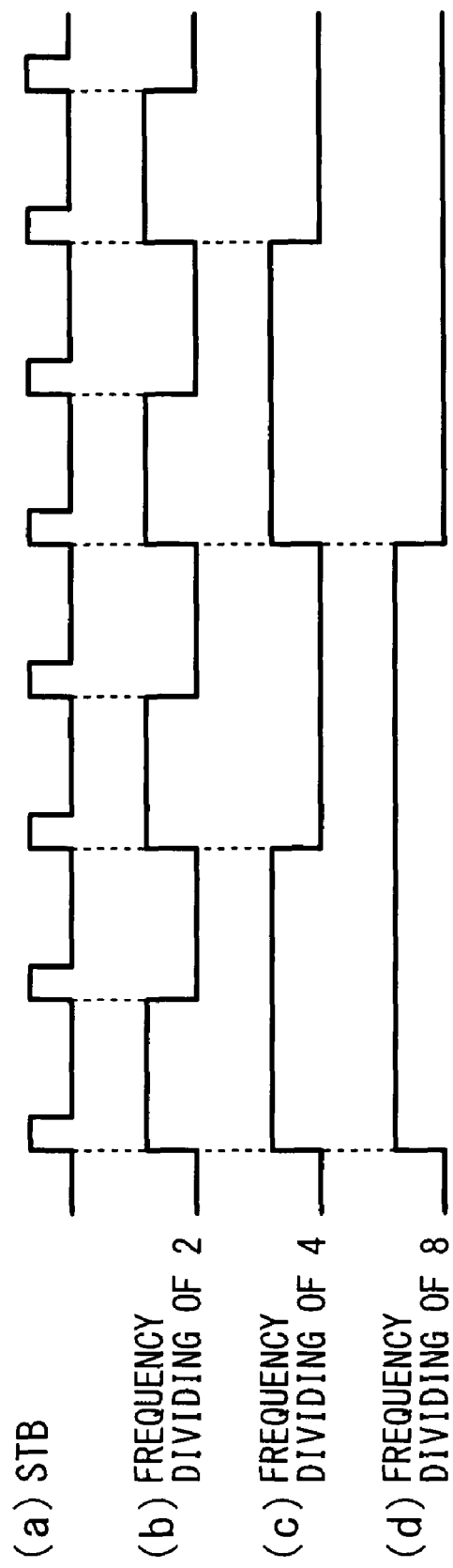

| SW3 | SW2 | SW1 | OUTPUT CURRENT |
|---|---|---|---|
| L | L | L | $I_{r1}/8 + I_{r2}$ |
| L | L | H | $2I_{r1}/8 + I_{r2}$ |
| L | H | L | $3I_{r1}/8 + I_{r2}$ |
| L | H | H | $4I_{r1}/8 + I_{r2}$ |
| H | L | L | $5I_{r1}/8 + I_{r2}$ |
| H | L | H | $6I_{r1}/8 + I_{r2}$ |
| H | H | L | $7I_{r1}/8 + I_{r2}$ |
| H | H | H | $I_{r1} + I_{r2}$ |

VERTICAL SCANNING LINE (WHEN USING A 3-BIT DAC)

| A | B | C | CAPACITANCE VALUE |
|---|---|---|---|
| L | L | L | $C_1$ |
| L | L | H | $C_1+C_2$ |
| L | H | L | $C_1+2C_2$ |
| L | H | H | $C_1+3C_2$ |
| H | L | L | $C_1+4C_2$ |
| H | L | H | $C_1+5C_2$ |
| H | H | L | $C_1+6C_2$ |
| H | H | H | $C_1+7C_2$ |

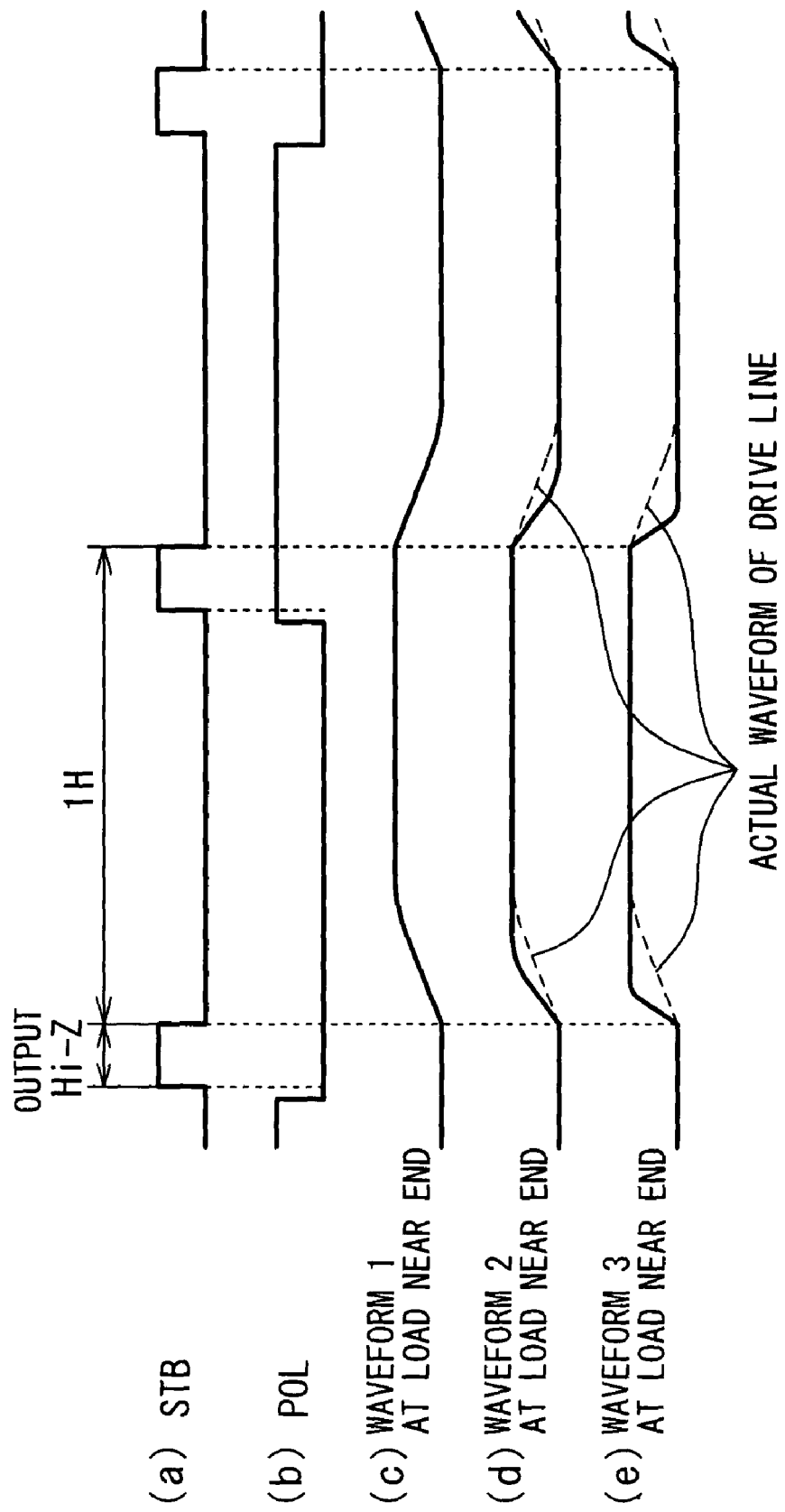

US 8,085,234 B2

CAPACITIVE LOAD DRIVING CIRCUIT, METHOD OF DRIVING CAPACITIVE LOAD, METHOD OF DRIVING LIQUID CRYSTAL DISPLAY DEVICE

BACKGROUND OF THE INVENTION

1. Field of the Invention

The present invention relates to a capacitive load driving circuit and a method of driving a capacitive load. More particularly, the present invention relates to a capacitive load driving circuit and a method of driving a capacitive load used for a capacitive load such as a liquid crystal display panel.

2. Description of Related Art

In a recent trend of thin flat panels, a size thereof has been increasingly growing. In the field of televisions in particular, even some liquid crystal panels have a size of over 50 inches. This tendency will be unchanged for some time in the future. However, a data line load of a TFT (Thin Film Transistor) is increasingly heavier as the size of the thin flat panel increases. This causes a problem that data writing cannot be performed up to the farthest end of a data line in one horizontal period (1 H period). To deal with this problem, in an output amplifier of a source driver (horizontal driver), effort has been made so far to increase a slew rate such that the data writing up to the farthest end of the data line (farthest end driving) can be performed in the 1 H period. However, a problem has arisen that power consumption of a source driver is increased and the chip temperature unusually gets high, when the output amplifier is designed such that the slew rate is appropriate to farthest end driving. To deal with the increase in the chip temperature, such measures may be taken as adding some changes to a tape on which a chip is provided in order to keep thermal resistance low, and applying a heat release tape to a chip. However, all of these lead to an increase in costs.

FIG. 1 is a block diagram showing a configuration example of a liquid crystal display device. The liquid crystal display device applies analog data signals generated based on digital video data to a liquid crystal panel. The liquid crystal display device includes a liquid crystal panel 1, a control circuit 2, a grayscale power supply circuit 3, a data line driving circuit (source driver) 4, and a scanning line driving circuit (gate driver) 5.

The liquid crystal panel 1 is a liquid crystal panel of an active matrix type with thin film transistors (TFTs) used as switch elements. In the liquid crystal panel 1, pixels are provided at regions corresponding to crossover points between n number (n is a natural number) of scanning lines $6_1$ to $6_n$ and m number (m is a natural number) of data lines $7_1$ to $7_m$. The n number of scanning lines (gate lines) $6_1$ to $6_n$ are provided in the row direction with given spacing. The m number of data lines (source lines) $7_1$ to $7_m$ are provided in the column direction with given spacing. Therefore, the number of pixels in the entire display screen is n times m. Each pixel of the liquid crystal panel 1 includes a liquid crystal capacitance 8, a common electrode 9, and a TFT 10. The liquid crystal capacitance 8 is a capacitive load in terms of equivalence. The TFT drives a corresponding liquid crystal capacitance 8.

When the liquid crystal panel 1 is driven, a common potential Vcom is applied to the common electrode 9. Under this state, analog data signals generated based on digital video data are applied to the data lines $7_1$ to $7_m$. In addition, a gate pulse generated based on a horizontal synchronizing signal, a vertical synchronizing signal and so forth, is applied to the scanning lines $6_1$ to $6_n$. Consequently, characters, images and so forth are displayed on the display screen of the liquid crystal panel 1. As for color display, analog data red signals, analog data green signals, and analog data blue signals, which are generated based on red data, green data, and blue data of digital video data respectively, are applied to corresponding data lines. It means that operation is not directly affected just with data volume and circuitry being trebled. Therefore, the configuration and the operation with respect to the color display will not be explained here.

The control circuit 2 is composed of an ASIC (Application Specific Integrated Circuit) for example, and is supplied with a dot clock signal, a horizontal synchronizing signal and a vertical synchronizing signal, a data enable signal, and so forth, from the outside. Based on these input signals, the control circuit 2 generates control signals such as a strobe signal, a clock signal, a horizontal scanning pulse signal, a polarity signal, a vertical scanning pulse signal and so forth, to be supplied to the source driver 4 and the gate driver 5. The strobe signal is a signal with the same period as the horizontal synchronizing signal. The clock signal has an identical or different frequency in synchronization with the dot clock signal. The clock signal is used for example, to generate a sampling pulse from the horizontal scanning pulse signal, in a shift register included in the source driver 4. The horizontal scanning pulse signal is a signal with the same period as the horizontal synchronizing signal but delayed by several periods of the clock signal from the strobe signal. The polarity signal is inverted every one horizontal period, namely every one line, to drive the liquid crystal panel 1 in an alternate current manner. The polarity signal is also inverted every one vertical synchronizing period. The vertical scanning pulse signal is a signal with the same period as the vertical synchronizing signal.

The gate driver 5 sequentially generates a gate pulse in synchronization with timing of the vertical scanning pulse signal supplied from the control circuit 2. The gate driver 5 sequentially applies the generated gate pulse to the corresponding scanning lines $6_1$ to $6_n$ of the liquid crystal panel 1.

The grayscale power supply circuit 3 includes a plurality of resistances in a cascade connection between a reference voltage and ground, and a plurality of voltage followers with input nodes connected to connection points of adjacent resistances. The grayscale power supply circuit 3 amplifies grayscale voltages at the connection points of the adjacent resistances and supplies the amplified grayscale voltages to the source driver 4. The grayscale voltage is set for gamma transformation. Gamma transformation originally means to make correction to reverse a characteristic of a traditional image pickup tube, thereby restoring a normal video signal. Here, the gamma transformation corrects the analog video signal or the digital video data signal in order to obtain a reproduction image with fine grayscale, with the gamma of the entire system of the device being one (1). In general, gamma transformation is performed to an analog video signal or a digital video data signal for conformity to the characteristics of a CRT display, namely, to provide compatibility. Here, FIG. 2 is a graph showing an example of the relationship (gamma transformation characteristics) between 6-bit input data (given in hexadecimal (HEX)), and grayscale voltages V0 to V4 and V5 to V9.

As shown in FIG. 1, the source driver 4 includes a video data processing circuit 11, a digital-analog converter (DA converter) 12, and m number of output circuits $13_1$ to $13_m$.

The video data processing circuit 11 includes a shift register, a data register, a latch circuit, and a level shifter (not shown). The shift register is a serial-in/parallel-out shift register composed of a plurality of delay flip-flops. The shift register performs shift operation to shift the horizontal scanning pulse signal supplied from the control circuit 2 in synchronization with the clock signal supplied from the control circuit 2, and outputs a multiple-bit parallel sampling pulse. The data register receives data of digital video data signals, which are supplied from the outside, as display data in synchronization with the sampling pulse supplied from the shift register, and supplies the display data to the latch circuit. The latch circuit receives the display data supplied from the data register in synchronization with a rising edge of the strobe signal supplied from the control circuit 2. The latch circuit retains the received display data until the next strobe signal is supplied, namely, during one horizontal period. The level shifter converts voltages of output data of the latch circuit and outputs the data as voltage-converged display data.

The DA converter 12 gives a grayscale property to which gamma correction has been made, to the voltage-converged display data supplied from the video data processing circuit 11 based on a set of grayscale voltages V0 to v4 or a set of grayscale voltages V5 to V9 supplied from the grayscale power supply circuit 3. The DA converter 12 converts correction data to which gamma correction has been made, into analog data signals and supplies the analog data signals to the corresponding output circuits $13_1$ to $13_m$.

The output circuits $13_1$ to $13_m$ having the same configuration, are simply referred to as output circuit 13 when collectively mentioned. Similarly, the data lines (source lines) $7_1$ to $7_m$ are simply referred to as data line 7 when collectively mentioned. FIG. 3 is a circuit diagram showing a configuration example of the output circuit. The output circuit 13 includes voltage followers $14_1$ and $14_2$, and switches $15_1$ and $15_2$, and drives the data line 7.

The switch $15_1$ is switched on when a polarity signal POL supplied from the control circuit 2 is "H" level and applies a positive-polarity data signal S supplied from the voltage follower $14_1$ to the corresponding data line 7 of the liquid crystal panel 1. The switch $15_2$ is switched on when the polarity signal POL supplied from the control circuit 2 is "L" level and applies a negative-polarity data signal S supplied from the voltage follower $14_2$ to the corresponding data line 7 of the liquid crystal panel 1.

FIG. 4 is a circuit diagram showing a configuration example of the voltage follower $14_1$. The voltage follower $14_1$ includes a class A amplifier that includes N-channel MOS transistors MN1 and MN2, P-channel MOS transistors MP1 to MP3, constant current supplies CI1 and CI2, and a capacitor C1. The voltage follower $14_1$ amplifies a positive-polarity data signal supplied from the corresponding DA converter 12 to an input node Vin and outputs the amplified data signal from an output node Vout.

FIG. 5 is a circuit diagram showing a configuration example of the voltage follower $14_2$. The voltage follower $14_2$ includes a class A amplifier that includes P-channel MOS transistors MP4 and MP5, N-channel MOS transistors MN3 to MN5, constant current supplies CI3 and CI4, and a capacitor C2. The voltage follower $14_2$ amplifies a negative-polarity data signal supplied from the corresponding DA converter 12 to the input node Vin and outputs the amplified data signal from the output node Vout.

Next, an operation of the liquid crystal display device will be explained with reference to a timing chart. FIG. 6 is a view showing a timing chart of the operation of the liquid crystal display device. In FIG. 6, the period TF is one frame period and the period TH is one horizontal period. Here, a dot inversion driving method is employed as a driving method for driving the liquid crystal panel 1. That is to say, a polarity of a voltage applied to each of the data lines $7_1$ to $7_m$ is inverted every one dot (pixel) with respect to a common voltage Vcom applied to the common electrode 9. Generally, in a liquid crystal panel, continuously applying homopolar voltages to a liquid crystal cell causes a phenomenon called "burn-in" where traces of characters and so forth are left on a screen even after shutting off the electric power. The dot inversion driving method has been employed from the past to prevent "burn-in" of a liquid crystal panel. Usually, in a liquid crystal panel, a liquid crystal cell has approximately the same transmittance characteristic even when the polarity of the voltage applied to the liquid crystal cell is inverted. When using the inversion driving method therefore, it is general to use grayscale voltages with the identical voltage value both in the case of positive and negative polarities (positive-polarity and negative-polarity voltages having equal absolute values with respect to the common voltage Vcom).

A clock signal VCK indicated by (1) in FIG. 6 is a clock signal with the period TH used in the gate driver 5. The period TH is one horizontal period. The gate driver 5 sequentially generates gate pulses VG1, VG2, . . . , and VGn each one line in synchronization with pulses P1, P2, . . . , and Pn of the clock signal VCK respectively, as illustrated by (2) to (4) in FIG. 6 and sequentially applies the gate pulses VG1, VG2, . . . , and VGn to the scanning lines $6_1$, $6_2$, . . . , and $6_n$ of the liquid crystal panel 1 respectively.

On the other hand, the source driver 4 outputs data signals from the output circuits $13_1$, $13_2$, . . . , and $13_n$ to the data lines $7_1$, $7_2$, . . . , and $7_n$ respectively, as illustrated by (5) and (6) in FIG. 6. Each of the data signals are outputted a few microseconds after each of the gate pulses $VG_1$, $VG_2$, . . . , and $VG_n$ are generated. A data signal $VS_{even}$ illustrated by (5) in FIG. 6 shows a data signal outputted from even-numbered output circuits $13_{(2i)}$ and a data signal $VS_{odd}$ illustrated by (6) in FIG. 6 shows a data signal outputted from odd-numbered output circuits $13_{(2i-1)}$. That is, data signals $VS_2$, $VS_4$, . . . , and $VS_{(2i)}$ outputted from the output circuit $13_2$, $13_4$, . . . , and $13_{(2i)}$ to the data lines $7_2$, $7_4$, . . . , and $7_{(2i)}$ respectively, are referred to as the data signal $VS_{even}$ when collectively mentioned. Similarly, data signals $VS_1$, $VS_3$, . . . , and $VS_{(2i-1)}$ outputted from the output circuits $13_1$, $13_3$, . . . , and $13_{(2i-1)}$ to the data lines $7_1$, $7_3$, . . . , and $7_{(2i-1)}$ respectively, are referred to as the data signal $VS_{odd}$ when collectively mentioned.

FIG. 7 is a view showing equivalent parasitic resistances and equivalent parasitic capacitances of the data lines of the liquid crystal panel 1 in the liquid crystal display device. Since the configuration of FIG. 7 corresponds to that of FIG. 1, the detail explanation will be omitted here. With reference to FIG. 7, the data line 7 of the liquid crystal panel 1 connected to the output circuit 13 of the source driver 4 can be represented as a distributed constant circuit of resistances and capacitances. The nearest and farthest points to the liquid crystal panel from the source driver 4 are referred to as a load near end and a load far end respectively. Here, the liquid crystal panel 1 includes panel load equivalent circuits 70 ($70_1$ to $70_m$) as the distributed constant circuits.

We have now discovered following facts. Slew rates of the amplifiers shown in FIGS. 4 and 5 are designed in accordance with worst-case conditions of loads driven by the amplifiers. That is to say, slew rates of the amplifiers are designed based on load conditions of the drive line (load far end) farthest away from the drive line (load near end) where the source driver 4 is positioned. In this case, load conditions are increasingly stricter as the size of the liquid crystal panel 1 served as a load becomes larger. When a slew rate is designed with an increase therein such that the slew rate is adapted to the above worst-case conditions, it is necessary to increase a differential stage bias current in the first stage of the amplifier. When the differential stage bias current is increased, a current of the output stage of the amplifier should also be increased accordingly. This is because a problem arises that a phase margin cannot be secured, unless a ratio of the current in the first stage to the current in the last stage is a certain value or above (e.g. fivefold). In this way, designing an amplifier with an increase in the slew rate may cause power consumption to increase and the temperature of a semiconductor chip to exceed the maximum temperature thereof.

Relevant to a capacitive load driving circuit used for a driver section, which is an output stage of a driving circuit in a liquid crystal display device (LCD), for example, a technique is disclosed in Japanese Laid-Open Patent Application JP-P2000-338461A (corresponding to U.S. Pat. No. 6,624, 669B1). A driving circuit includes a level converting means, a first transistor, a first current controlling means, and a driving means. The level converting means performs level conversion of an input voltage into a first voltage. The first transistor receives the first voltage at a gate and outputs an output voltage based on the input voltage from a source. The first current controlling means controls a current that flows between the drain and source of the first transistor. The driving means makes the first transistor perform source follower operation.

As mentioned above, a driving circuit usable for a liquid crystal panel which is growing in size, requires that a slew rate should be increased based on load conditions, which may cause current consumption to be increased and the temperature of a semiconductor chip to exceed the maximum temperature thereof.

SUMMARY

The present invention seeks to solve one or more of the above problems, or to improve upon those problems at least in part. In one embodiment, a capacitive load driving circuit includes: a gate driver configured to drive a plurality of capacitive loads arranged in a matrix form in a row direction; and a source driver configured to drive said plurality of capacitive loads in a column direction, wherein said source driver includes: a plurality of output circuits configured to be arranged in a row direction, wherein each of said plurality of output circuits changes a slew rate based on a column position of a capacitive load of said plurality of capacitive loads.

In another embodiment, a method of driving a capacitive load, includes: (a) driving a plurality of capacitive loads arranged in a matrix form in a row direction; and (b) driving said plurality of capacitive loads in a column direction, wherein said step (b) includes: (b1) driving said plurality of capacitive loads by a plurality of output circuits arranged in a row direction, and (b2) changing a slew rate of each of said plurality of output circuits based on a column position of a capacitive load of said plurality of capacitive loads.

In the present invention, the source driver includes the plurality of output circuits, each of which can controls the slew rate based on the column position of the capacitive load. Therefore, an appropriate slew rate can be set for each drive line (in the column direction) having the capacitive loads. Therefore, it is unnecessary to increase the differential stage bias current in the first stage of the amplifier. Consequently, an expensive source driver tape of low thermal resistance is unnecessary or heat release parts of a chip are unnecessary, making it possible to reduce costs.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 14 is a timing chart showing an STB signal and examples of output waveforms of a frequency divider of the embodiment;

FIG. 22 is a graph showing waveforms in the liquid crystal panel of the embodiment.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of the present invention will be described with reference to the attached drawings. The present invention reduces excessive power consumption to achieve low power consumption by providing a circuit that controls a slew rate of an operational amplifier to be adapted to driving conditions and driving a load with an optimum slew rate.

Figure 8:
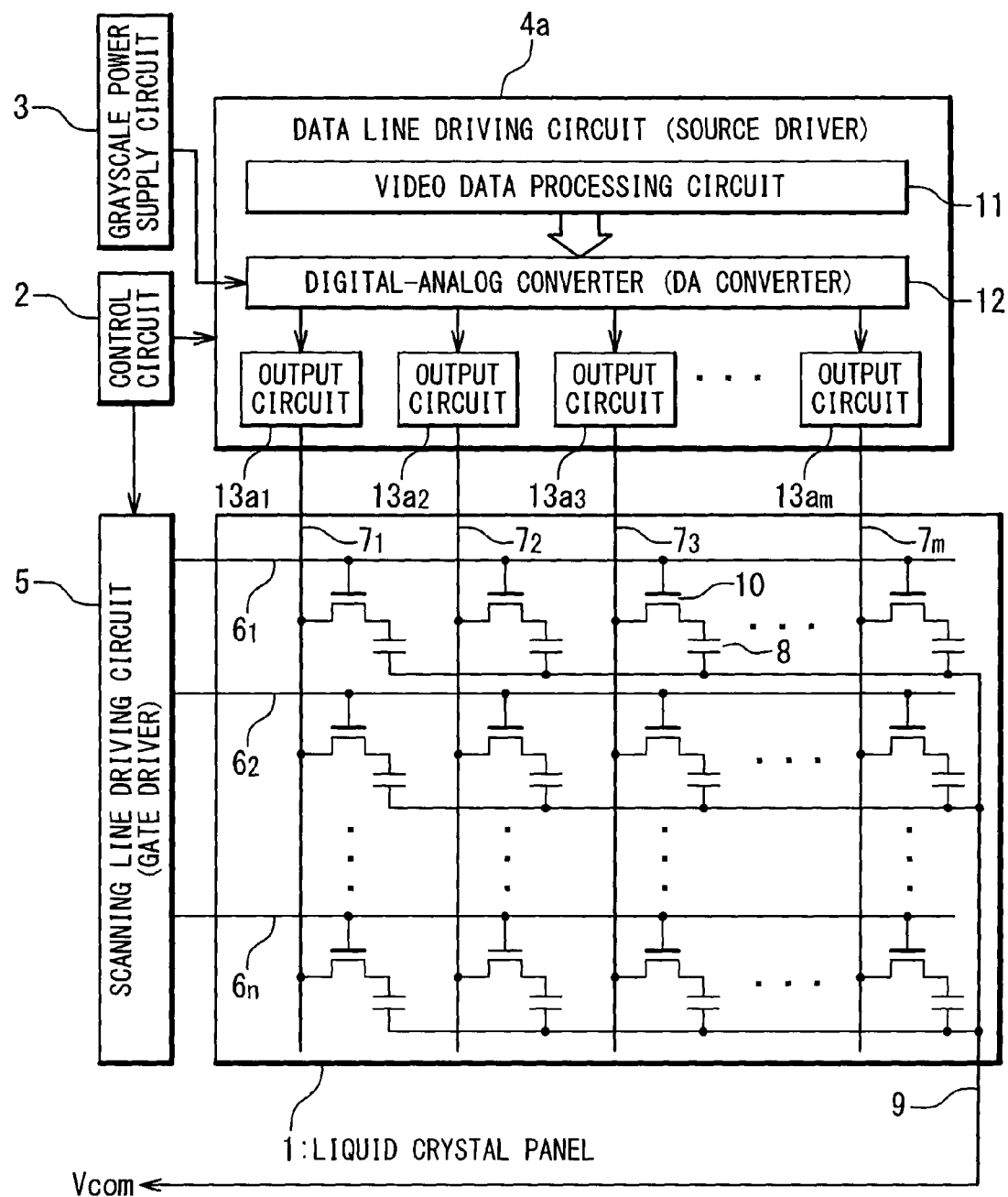
FIG. 8 is a block diagram showing a configuration example of a liquid crystal display device of an embodiment according to the present invention.

FIG. 8 is a block diagram showing a configuration example of a liquid crystal display device of the embodiment according to the present invention. The liquid crystal display device applies analog data signals generated based on digital video data to a liquid crystal panel. The liquid crystal display device includes a liquid crystal panel 1, a control circuit 2, a grayscale power supply circuit 3, a data line driving circuit (source driver) 4a, and a scanning line driving circuit (gate driver) 5.

The liquid crystal panel 1 is a liquid crystal panel of an active matrix type with thin film transistors (TFTs) used as switch elements. In the liquid crystal panel 1, pixels are provided at regions corresponding to crossover points between n number (n is a natural number) of scanning lines $6_1$ to $6_n$ and m number (m is a natural number) of data lines $7_1$ to $7_m$. The n number of scanning lines (gate lines) $6_1$ to $6_n$ are provided in the row direction with given spacing. The m number of data lines (source lines) $7_1$ to $7_m$ are provided in the column direction with given spacing. Therefore, the number of pixels in the entire display screen is n times m. Each pixel of the liquid crystal panel 1 includes a liquid crystal capacitance 8, a common electrode 9, and a TFT 10. The liquid crystal capacitance 8 is a capacitive load in terms of equivalence. The TFT drives a corresponding liquid crystal capacitance 8.

When the liquid crystal panel 1 is driven, a common potential Vcom is applied to the common electrode 9. Under this state, analog data signals generated based on digital video data are applied to the data lines $7_1$ to $7_m$. In addition, a gate pulse generated based on a horizontal synchronizing signal, a vertical synchronizing signal and so forth, is applied to the scanning lines $6_1$ to $6_n$. Consequently, characters, images and so forth are displayed on the display screen of the liquid crystal panel 1. As for color display, analog data red signals, analog data green signals, and analog data blue signals, which are generated based on red data, green data, and blue data of digital video data respectively, are applied to corresponding data lines. It means that operation is not directly affected just with data volume and circuitry being trebled. Therefore, the configuration and the operation with respect to the color display will not be explained here.

The control circuit 2 is composed of an ASIC for example, and is supplied with a dot clock signal, a horizontal synchronizing signal and a vertical synchronizing signal, a data enable signal, and so forth, from the outside. Based on these input signals, the control circuit 2 generates control signals such as a strobe signal, a clock signal, a horizontal scanning pulse signal, a polarity signal, a vertical scanning pulse signal and so forth, to be supplied to the source driver 4a and the gate driver 5. The strobe signal is a signal with the same period as the horizontal synchronizing signal. The clock signal has an identical or different frequency in synchronization with the dot clock signal. The clock signal is used for example, to generate a sampling pulse from the horizontal scanning pulse signal, in a shift register included in the source driver 4a. The horizontal scanning pulse signal is a signal with the same period as the horizontal synchronizing signal but delayed by several periods of the clock signal from the strobe signal. The polarity signal is inverted every one horizontal period, namely every one line, to drive the liquid crystal panel 1 in an alternate current manner. The polarity signal is also inverted every one vertical synchronizing period. The vertical scanning pulse signal is a signal with the same period as the vertical synchronizing signal.

The gate driver 5 sequentially generates a gate pulse in synchronization with timing of the vertical scanning pulse signal supplied from the control circuit 2. The gate driver 5 sequentially applies the generated gate pulse to the corresponding scanning lines $6_1$ to $6_n$ of the liquid crystal panel 1.

Figure 1:
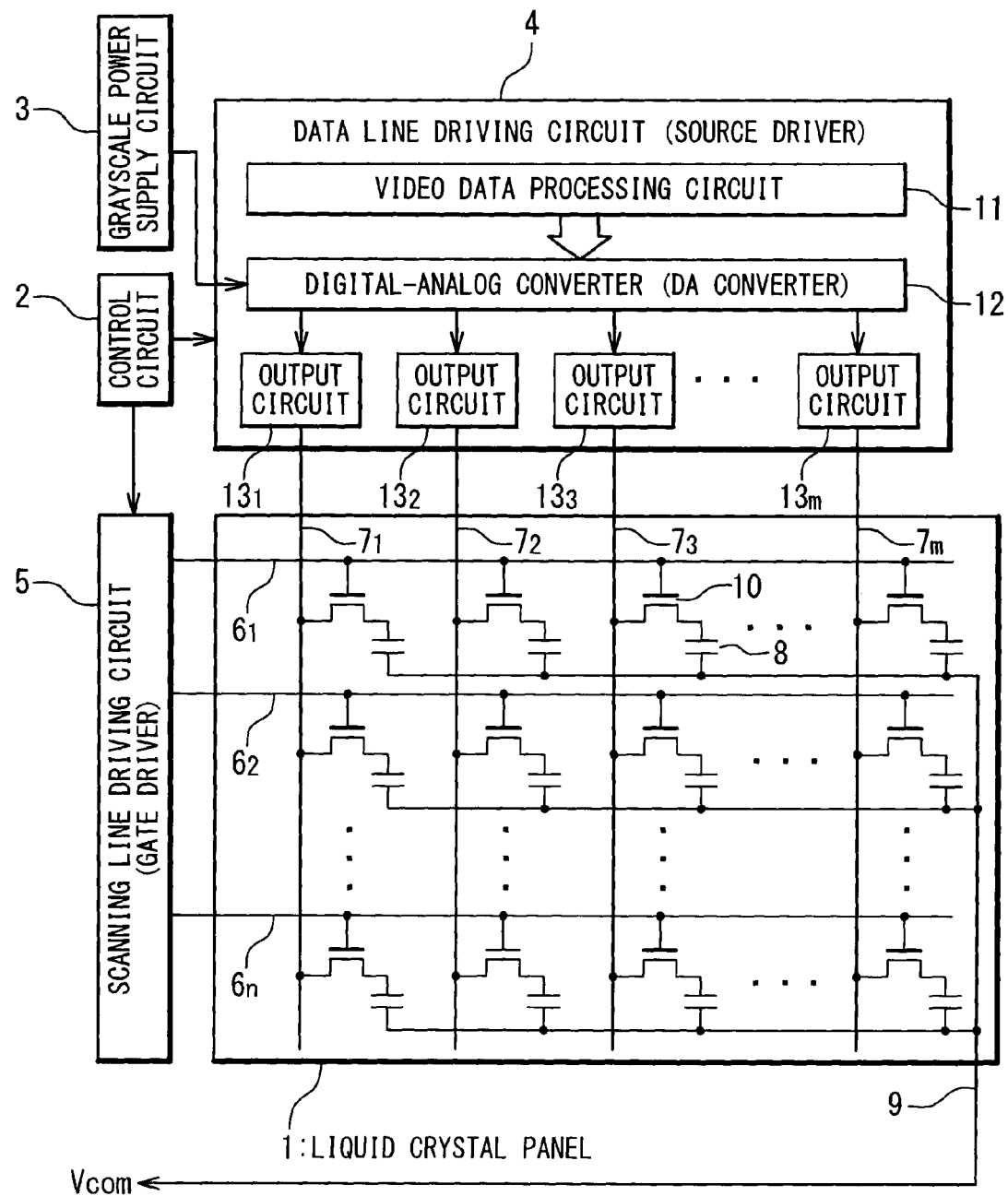
FIG. 1 is a block diagram showing a configuration example of a liquid crystal display device.
Figure 2:
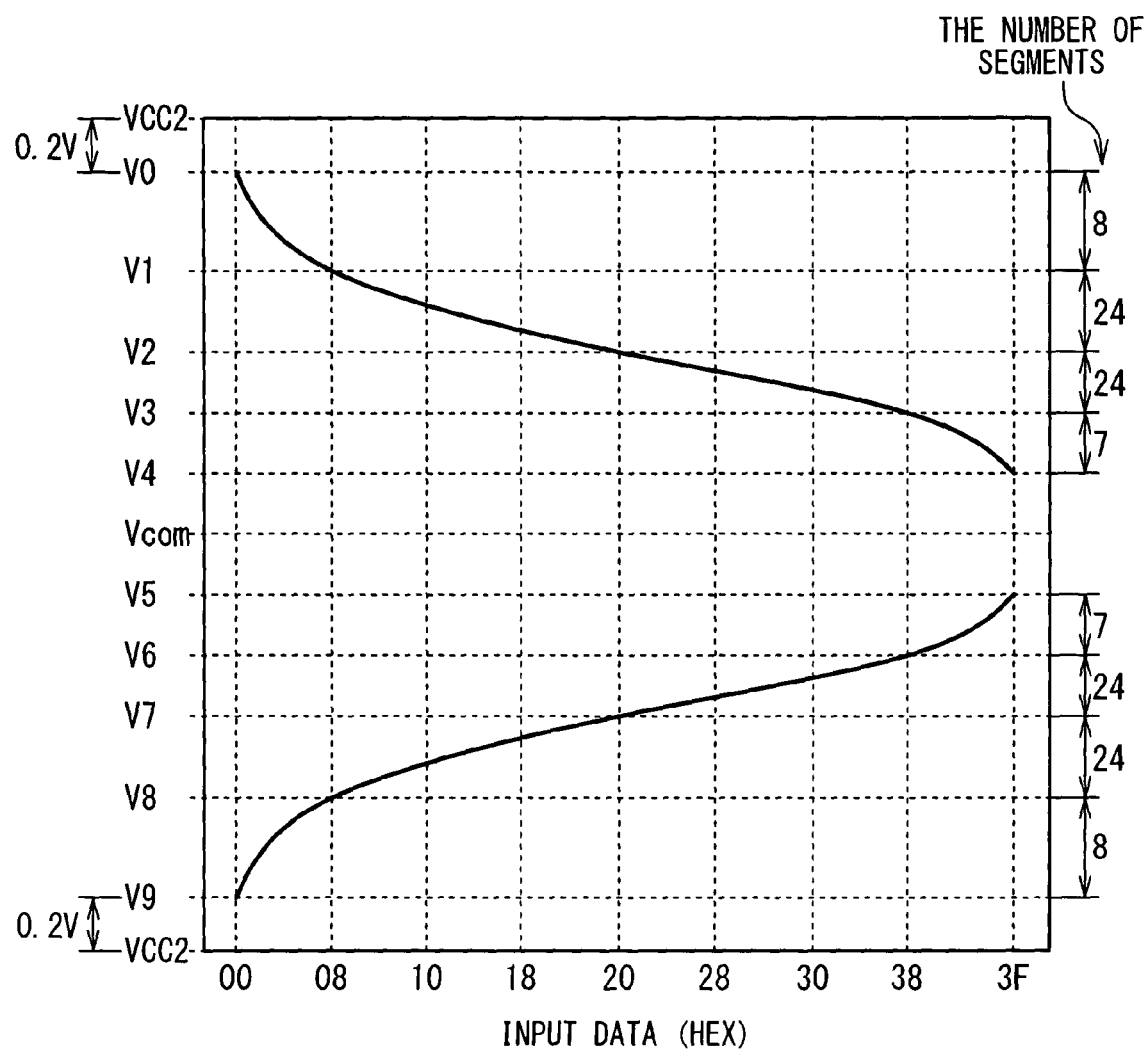
FIG. 2 is a graph showing an example of the relationship between 6-bit input data, and grayscale voltages V0 to V4 and V5 to V9.
Figure 3:
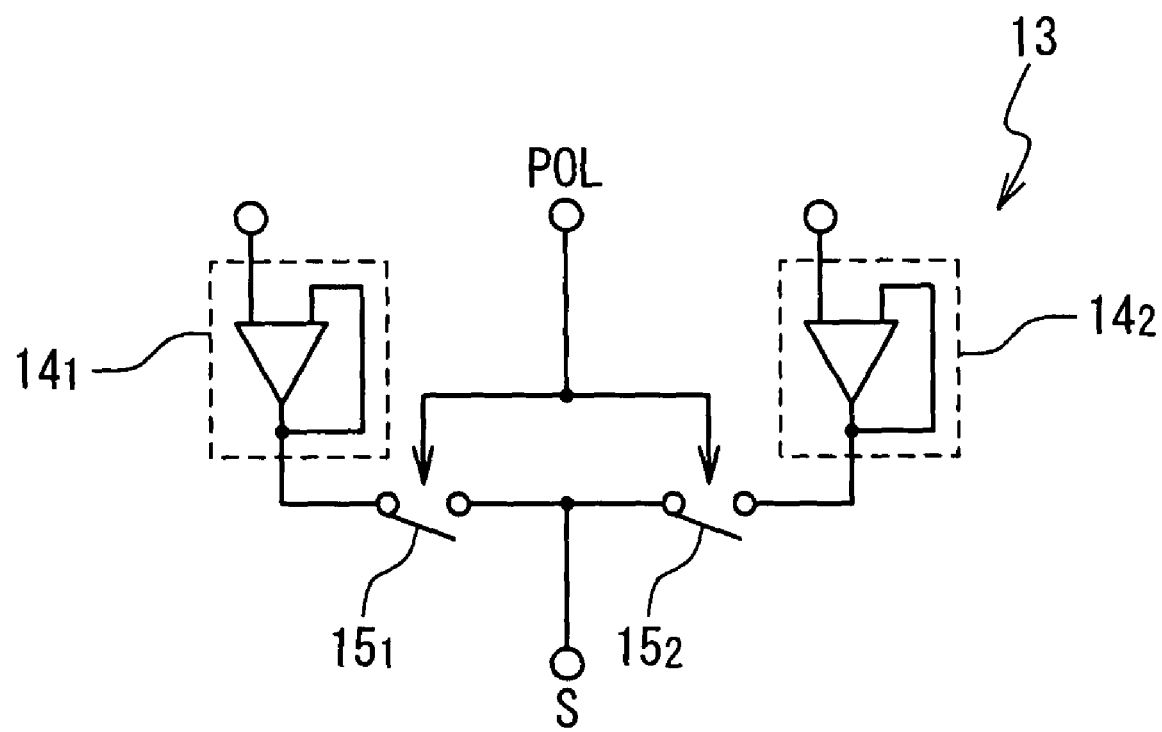
FIG. 3 is a circuit diagram showing a configuration example of the output circuit.
Figure 4:
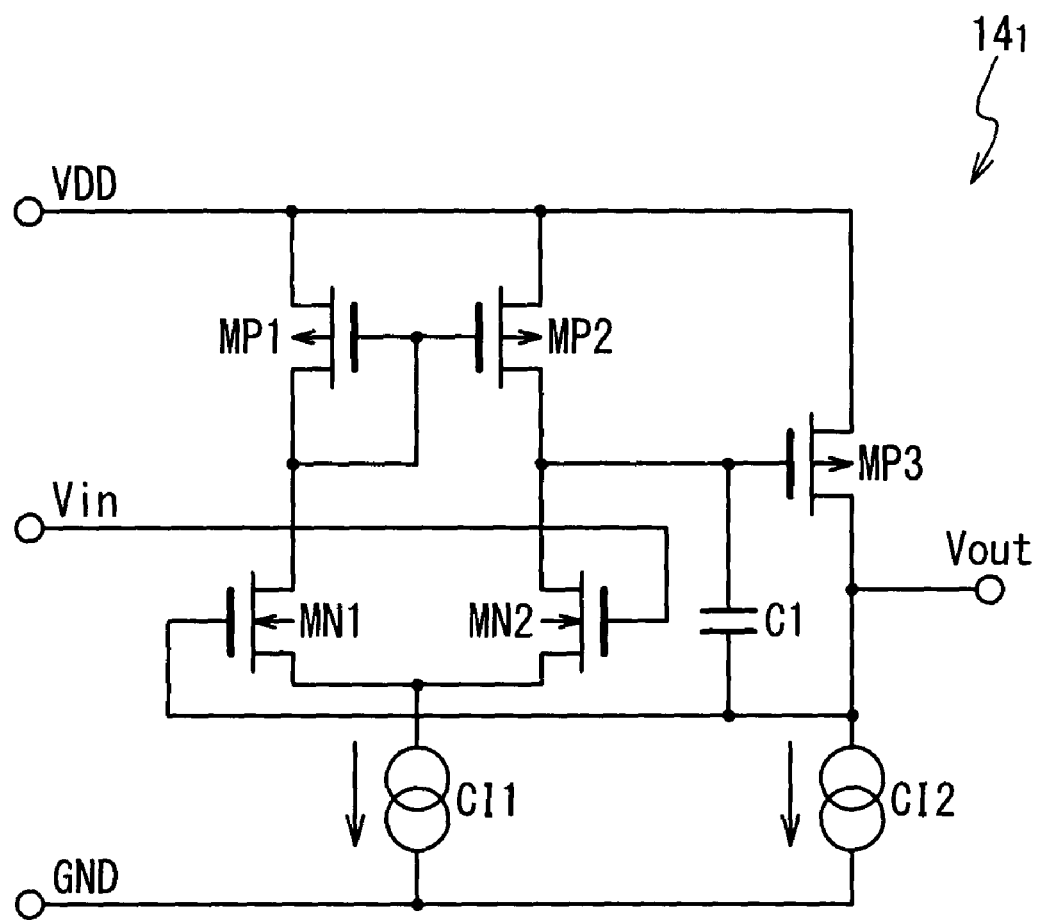
FIG. 4 is a circuit diagram showing a configuration example of the voltage follower of the output circuit.
Figure 5:
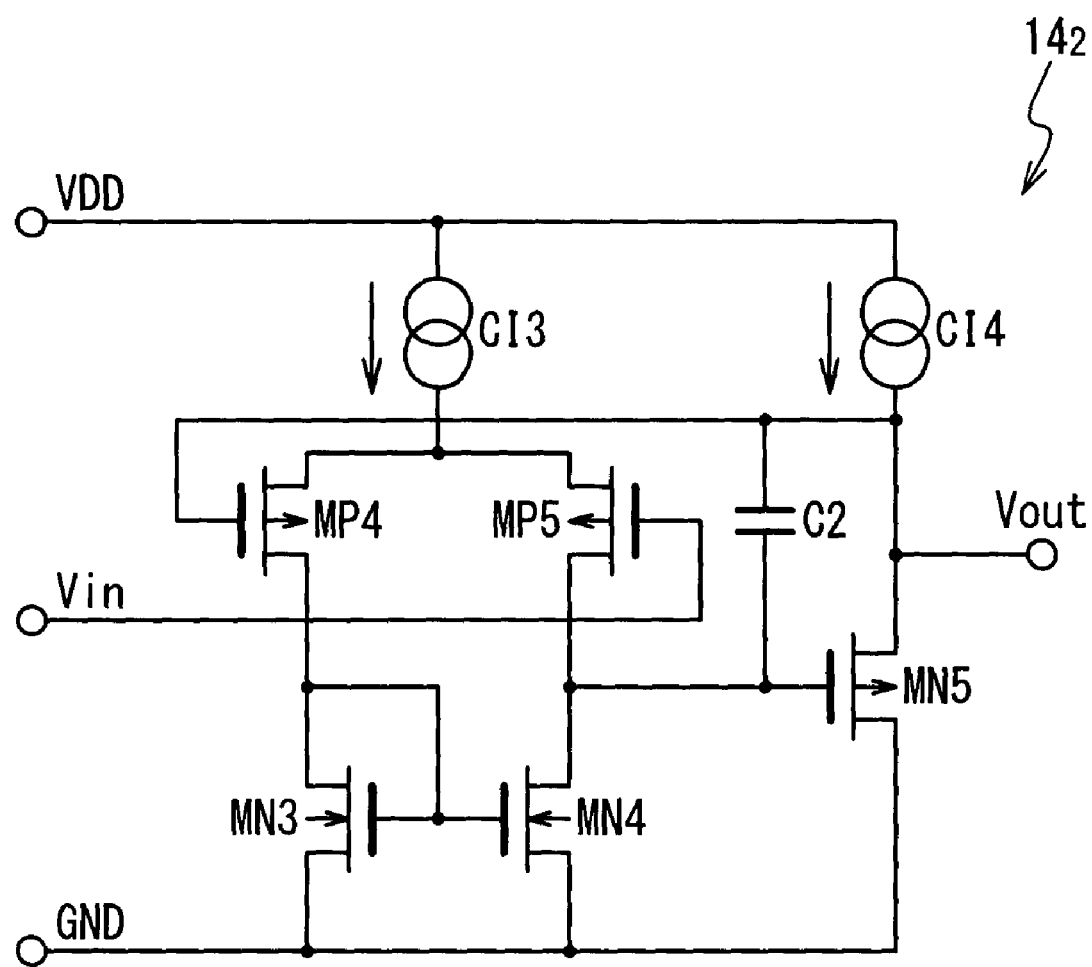
FIG. 5 is a circuit diagram showing a configuration example of the voltage follower of the output circuit.
Figure 6:
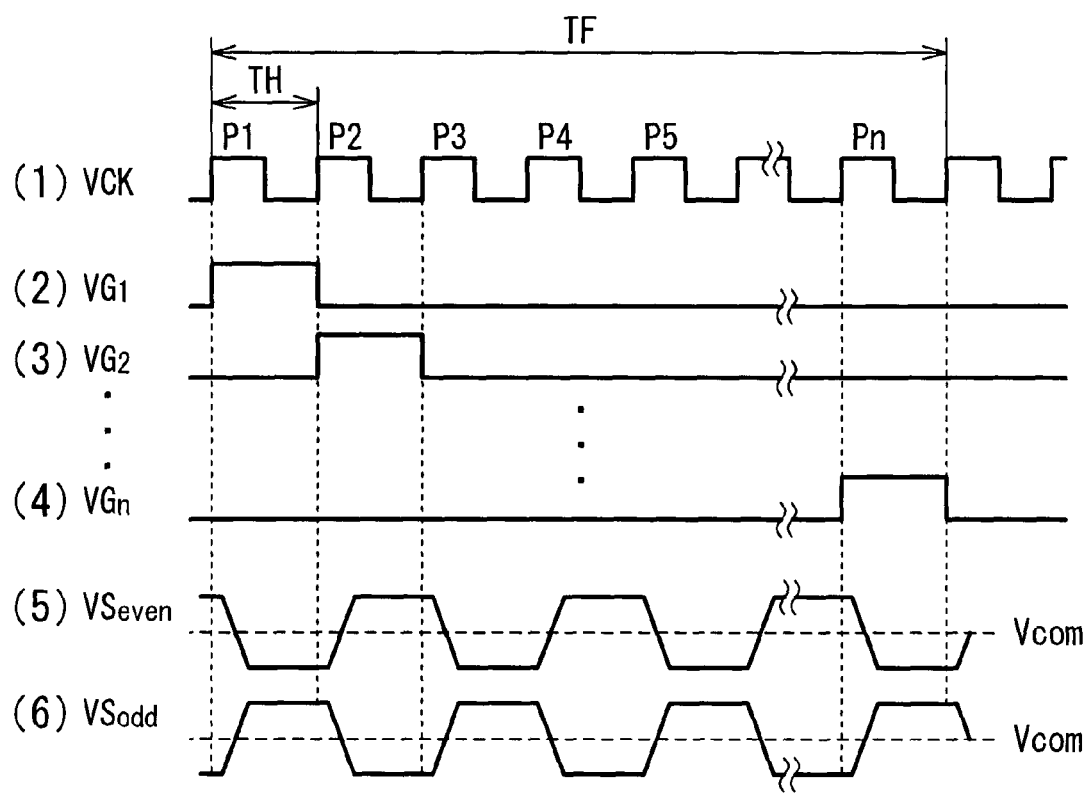
FIG. 6 is a view showing a timing chart of the operation of the liquid crystal display device.
Figure 7:
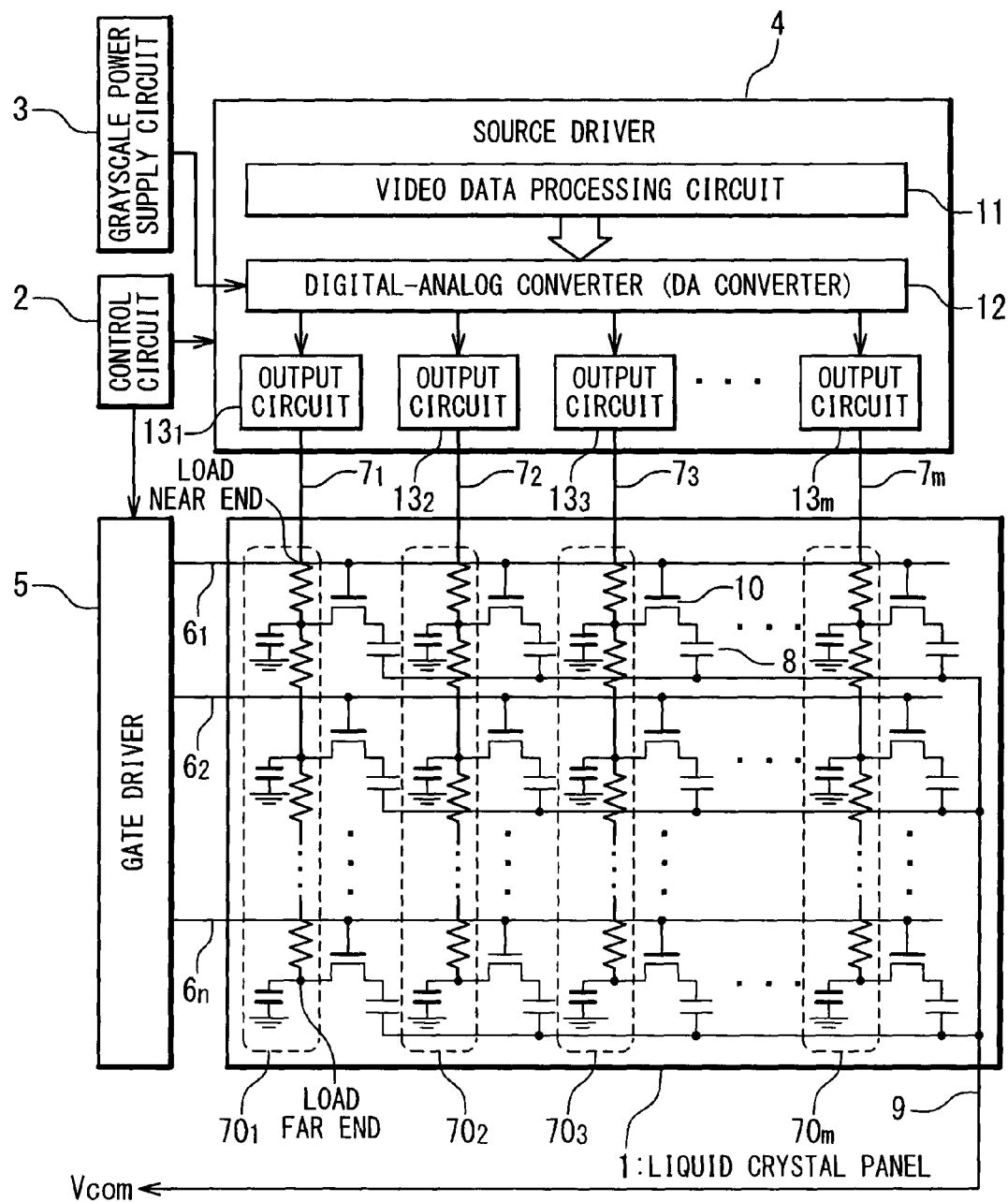
FIG. 7 is a view showing equivalent parasitic resistances and equivalent parasitic capacitances of data lines of the liquid crystal panel in the liquid crystal display device.

The grayscale power supply circuit 3 includes a plurality of resistances in a cascade connection between a reference voltage and ground, and a plurality of voltage followers with input nodes connected to connection points of adjacent resistances. The grayscale power supply circuit 3 amplifies grayscale voltages at the connection points of the adjacent resistances and supplies the amplified grayscale voltages to the source driver 4a. The grayscale voltage is set for gamma transformation. Gamma transformation originally means to make correction to reverse a characteristic of a traditional image pickup tube, thereby restoring a normal video signal. Here, the gamma transformation corrects the analog video signal or the digital video data signal in order to obtain a reproduction image with fine grayscale, with the gamma of the entire system of the device being one (1). In general, gamma transformation is performed to an analog video signal or a digital video data signal for conformity to the characteristics of a CRT display, namely, to provide compatibility. As mentioned before, FIG. 2 shows an example of the relationship (gamma transformation characteristics) between 6-bit input data (given in hexadecimal (HEX)), and grayscale voltages V0 to V4 and V5 to V9.

As shown in FIG. 8, the source driver 4a includes a video data processing circuit 11, a digital-analog converter (DA converter) 12, and m number of output circuits $13a_1$ to $13a_m$.

The video data processing circuit 11 includes a shift register, a data register, a latch circuit, and a level shifter (not shown). The shift register is a serial-in/parallel-out shift register composed of a plurality of delay flip-flops. The shift register performs shift operation to shift the horizontal scanning pulse signal supplied from the control circuit 2 in synchronization with the clock signal supplied from the control circuit 2, and outputs a multiple-bit parallel sampling pulse. The data register receives data of digital video data signals, which are supplied from the outside, as display data in synchronization with the sampling pulse supplied from the shift register, and supplies the display data to the latch circuit. The latch circuit receives the display data supplied from the data register in synchronization with a rising edge of the strobe signal supplied from the control circuit 2. The latch circuit retains the received display data until the next strobe signal is supplied, namely, during one horizontal period. The level shifter converts voltages of output data of the latch circuit and outputs the data as voltage-converged display data.

The DA converter 12 gives a grayscale property to which gamma correction has been made, to the voltage-converged display data supplied from the video data processing circuit 11 based on a set of grayscale voltages V0 to V4 or a set of grayscale voltages V5 to V9 supplied from the grayscale power supply circuit 3. The DA converter 12 converts correction data to which gamma correction has been made, into analog data signals and supplies the analog data signals to the corresponding output circuits $13a_1$ to $13a_m$.

Figure 9:
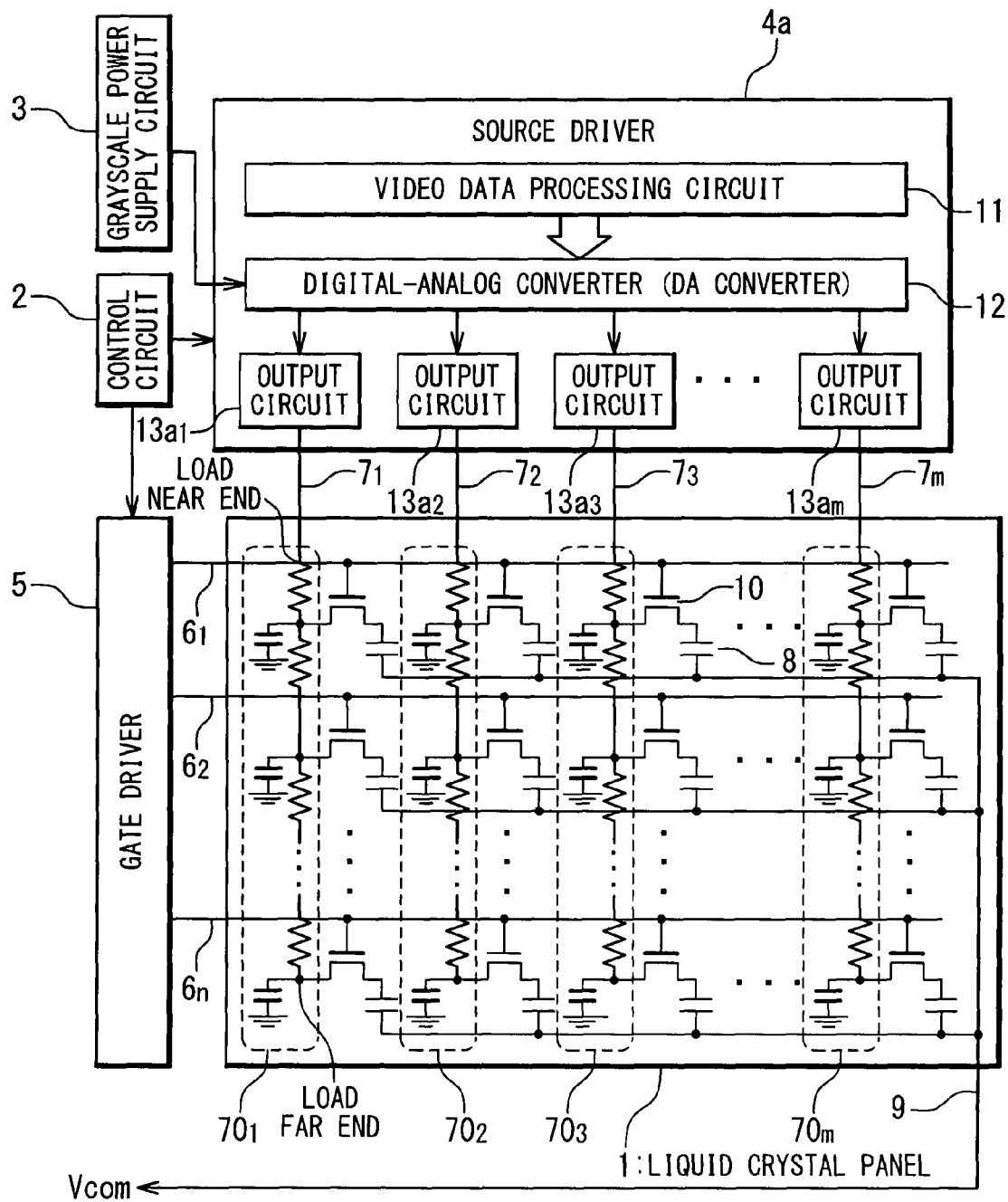
FIG. 9 is a view showing equivalent parasitic resistances and equivalent parasitic capacitances of data lines of the liquid crystal panel in the liquid crystal display device of the embodiment.

The output circuits $13a_1$ to $13a_m$ having the same configuration, are simply referred to as output circuit 13a when collectively mentioned. Similarly, the data lines (source lines) $7_1$ to $7_m$ are simply referred to as data line 7 when collectively mentioned. FIG. 9 is a view showing equivalent parasitic resistances and equivalent parasitic capacitances of the data lines of the liquid crystal panel. Since the configuration of FIG. 9 corresponds to that of FIG. 8, the detail explanation will be omitted here. With reference to FIG. 9, the data line 7 of the liquid crystal panel 1 connected to the output circuit 13a of the source driver 4a can be represented as a distributed constant circuit of resistances and capacitances. The nearest and farthest points to the liquid crystal panel from the source driver 4a are referred to as a load near end and a load far end respectively. Here, the liquid crystal panel 1 includes panel load equivalent circuits 70 ($70_1$ to $70_m$) as the distributed constant circuits.

Figure 10A:
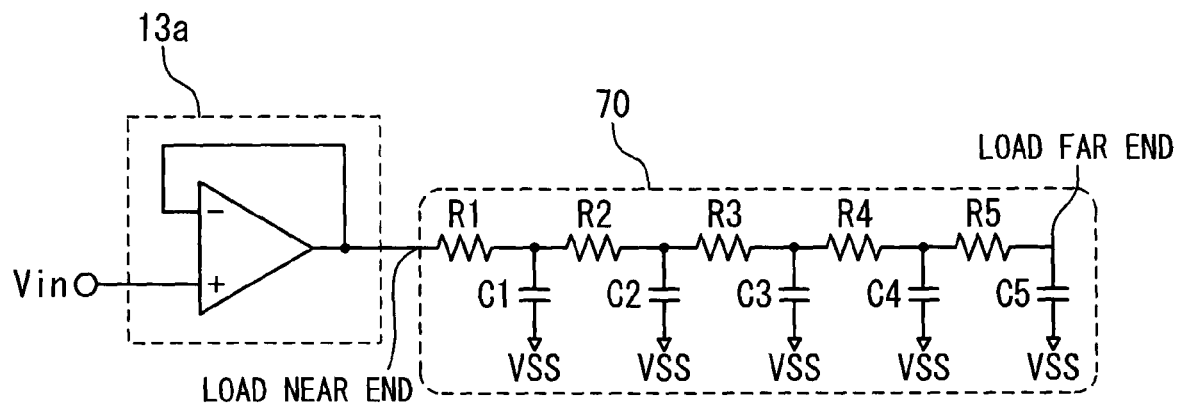
FIG. 10A is a circuit diagram showing one panel load equivalent circuit of the liquid crystal panel in the liquid crystal display device of the embodiment.

FIG. 10A is a circuit diagram showing one panel load equivalent circuit of the liquid crystal panel. As mentioned above, the source line 7 of the liquid crystal panel 1 which is driven by the output circuit 13a, can be replaced with the panel load equivalent circuit 70, as shown in FIG. 10A. The panel load equivalent circuit 70, which represents the source line 7, is expressed by distributed resistances R1, R2 and so forth and distributed capacitances C1, C2 and so forth. The nearest and farthest points from the output circuit 13a of the panel load equivalent circuit 70 are referred to as the load near end and the load far end, respectively.

Figure 10B:
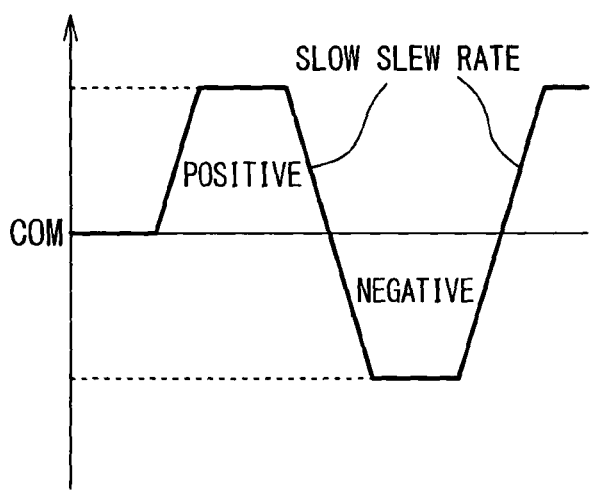
FIGS. 10B and 10C are graphs showing examples of output driving waveforms of an output circuit in the liquid crystal display device of the embodiment.
Figure 10C:
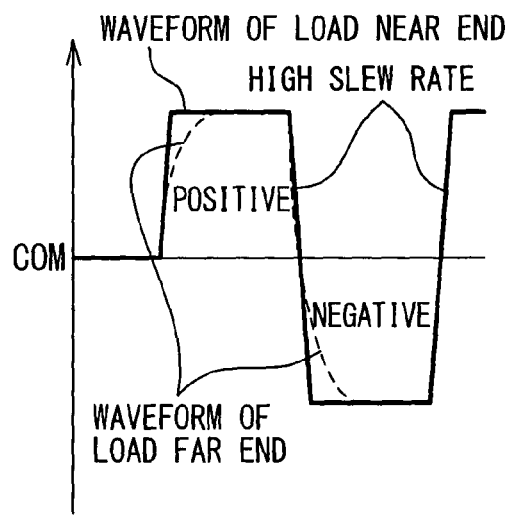

FIGS. 10B and 10C are graphs showing examples of output driving waveforms of the output circuit. When the first line (corresponding to the gate line $6_1$), which is the load near end, is driven, the slew rate of the output circuit 13a is reduced as shown in FIG. 10B (slow slew rate). As a line to be driven gets farther away from the output circuit 13a, the slew rate of the output circuit 13a is increased. When the last line (corresponding to the gate line $6_n$), which is the load far end, is driven, the slew rate of the output circuit 13a is maximized as shown in FIG. 10C (high slew rate). The solid line and the broken line show waveforms at the load near end and the load far end respectively, when the slew rate of the output circuit 13a is maximized. A signal outputted at a high slew rate shows a steep rising edge but a rising edge is less steep as indicated by the broken line when the load far end is reached through panel load equivalent circuit 70 represented by the distributed constant circuit.

As explained above, a circuit is provided for controlling a slew rate of an operational amplifier included in the output circuit 13a, for the purpose of controlling the slew rate to change based on a line to be driven. Consequently, voltage waveforms applied to pixel capacitances of the liquid crystal panel 1 are unified. That is, the first line is driven at the minimum slew rate while the line farthest away from the source driver 4a is driven at the maximum slew rate. The slew rate is gradually increased from the slew rate at which the first line is driven to the slew rate at which the last line is driven, based on the position of the gate driver 5. As a result, each line can be driven at the respective optimum slew rate, making it possible to perform driving with uniform output waveforms for each pixel capacitance. In addition, decreasing the slew rate in driving the near end makes it possible to reduce excessive power consumption to achieve low power consumption.

Figure 11:
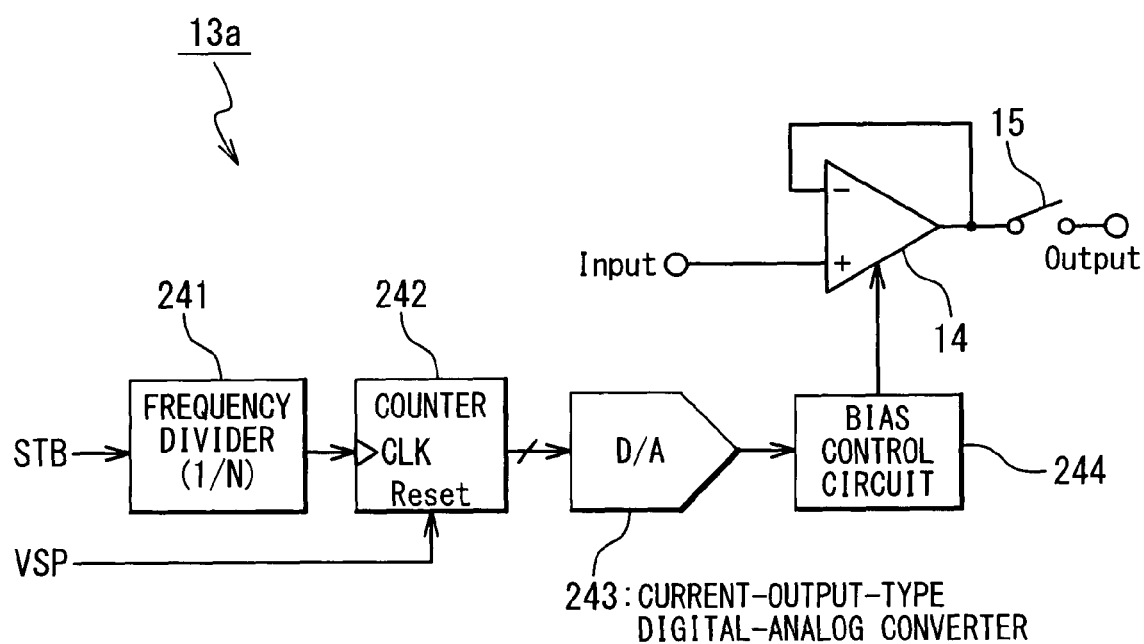
FIG. 11 is a block diagram showing a configuration example of an output circuit in the liquid crystal display device of the embodiment.

FIG. 11 is a block diagram showing a configuration example of the output circuit. The output circuit 13a includes an output amplifier 14, a switch 15, a frequency divider 241, a counter 242, a current-output-type digital-analog converter 243, and a bias control circuit 244. The slew rate of the output amplifier 14 is controlled by the frequency divider 241, the counter 242, the current-output-type digital-analog converter 243, and the bias control circuit 244.

Figure 12:
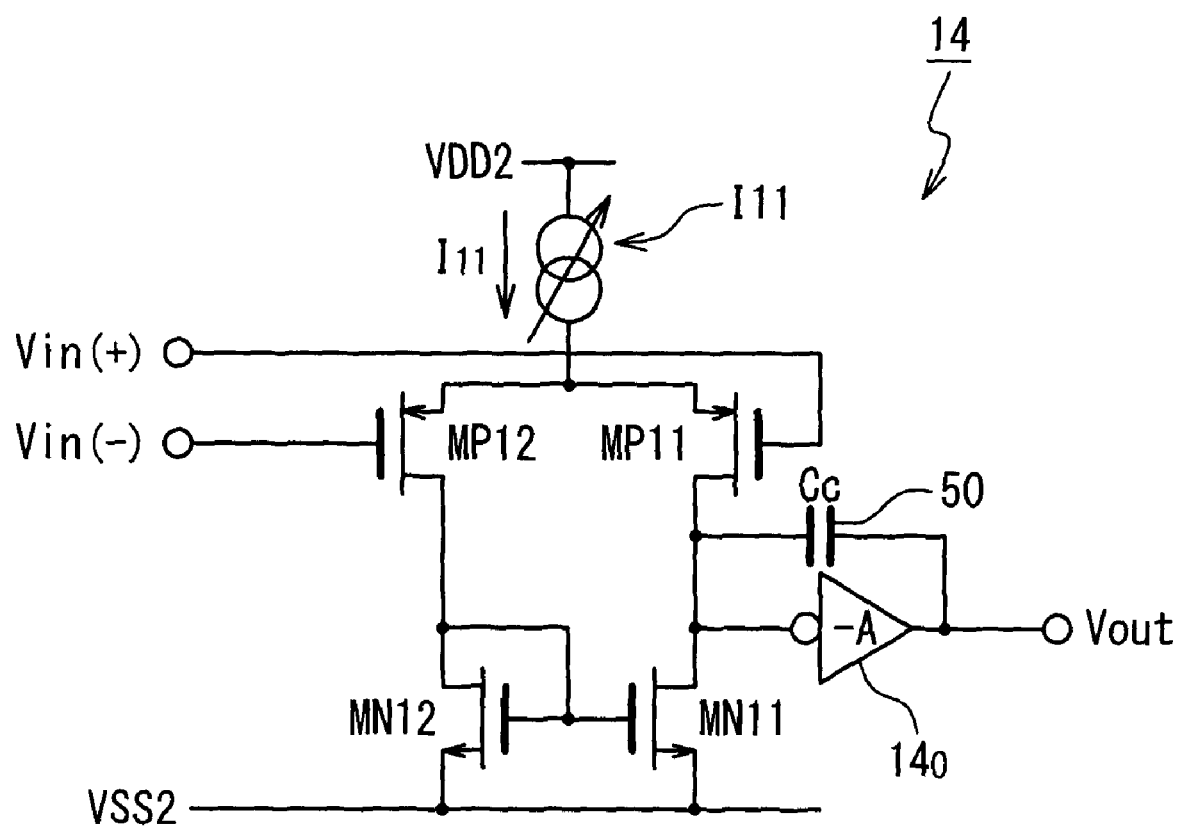
FIG. 12 is a circuit diagram showing a configuration example of an output amplifier for controlling a slew rate in the liquid crystal display device of the embodiment.

FIG. 12 is a circuit diagram showing a configuration example of the output amplifier for controlling the slew rate. The output amplifier 14 includes P-channel MOS transistors MP11 and MP12, N-channel MOS transistors MN11 and MN12, a variable constant current supply I11, an inverting amplifier (−A) $14_0$, and a phase compensation capacitance 50 (capacitance value: Cc). The sources of the P-channel MOS transistors MP11 and MP12 forming a differential stage, are connected in common and connected to the variable constant current supply I11. The drains of the N-channel MOS transistors MN11 and MN12 are connected to the drains of the P-channel MOS transistors MP11 and MP12, respectively. The sources of the N-channel MOS transistors MN11 and MN12 are connected to a power supply VSS2. The variable constant current supply I11 is provided between a positive power supply VDD2 and the sources of the differential stage connected in common, and supplies a current $I_{11}$ to the differential stage. The inverting amplifier $14_0$ receives a signal that is generated from an output of the differential stage as a result of single conversion. Then, the inverting amplifier $14_0$ amplifies the signal and outputs it as an output Vout. The phase compensation capacitance 50 is connected between the input and output of the inverting amplifier $14_0$.

The P-channel MOS transistors MP11 and MP12 form the differential stage, and output differential input voltages received at the respective gates to the respective drains. The outputs of the respective drains are connected to the input and output of a current mirror circuit that includes the N-channel MOS transistors MN11 and MN12. The N-channel MOS transistors MN11 and MN12 have both a function of an active load of the differential stage and a function of differential and single conversion as a result of current mirror connection. In other words, the current mirror circuit serves not only as the active load of the differential stage and but also as a differential/single conversion circuit. Here, the drain of the N-channel MOS transistor MN11 is an output node after single conversion. The output of the differential stage is received at the inverting amplifier $14_0$, which is outputted to the last output node Vout. The capacitance 50 (capacitance value: Cc) provided between the input and output of the inverting amplifier $14_0$ is a mirror capacitance, which is used for phase compensation.

As for the output amplifier 14 shown in FIG. 12, a slew rate SR is determined by a bias current $I_{11}$ through a differential stage and the phase compensation capacitance 50. That is to say, the following formula (1) is given:

$$SR = I_{11}/Cc (V/\mu s) \tag{1}$$

As understood from the formula (1), increasing the slew rate SR requires a reduction in the phase compensation capacitance Cc or an increase in the bias current $I_{11}$. Here, a case will be explained that the increase and decrease of the slew rate SR are controlled by controlling the variable constant current supply I11.

Figure 13:
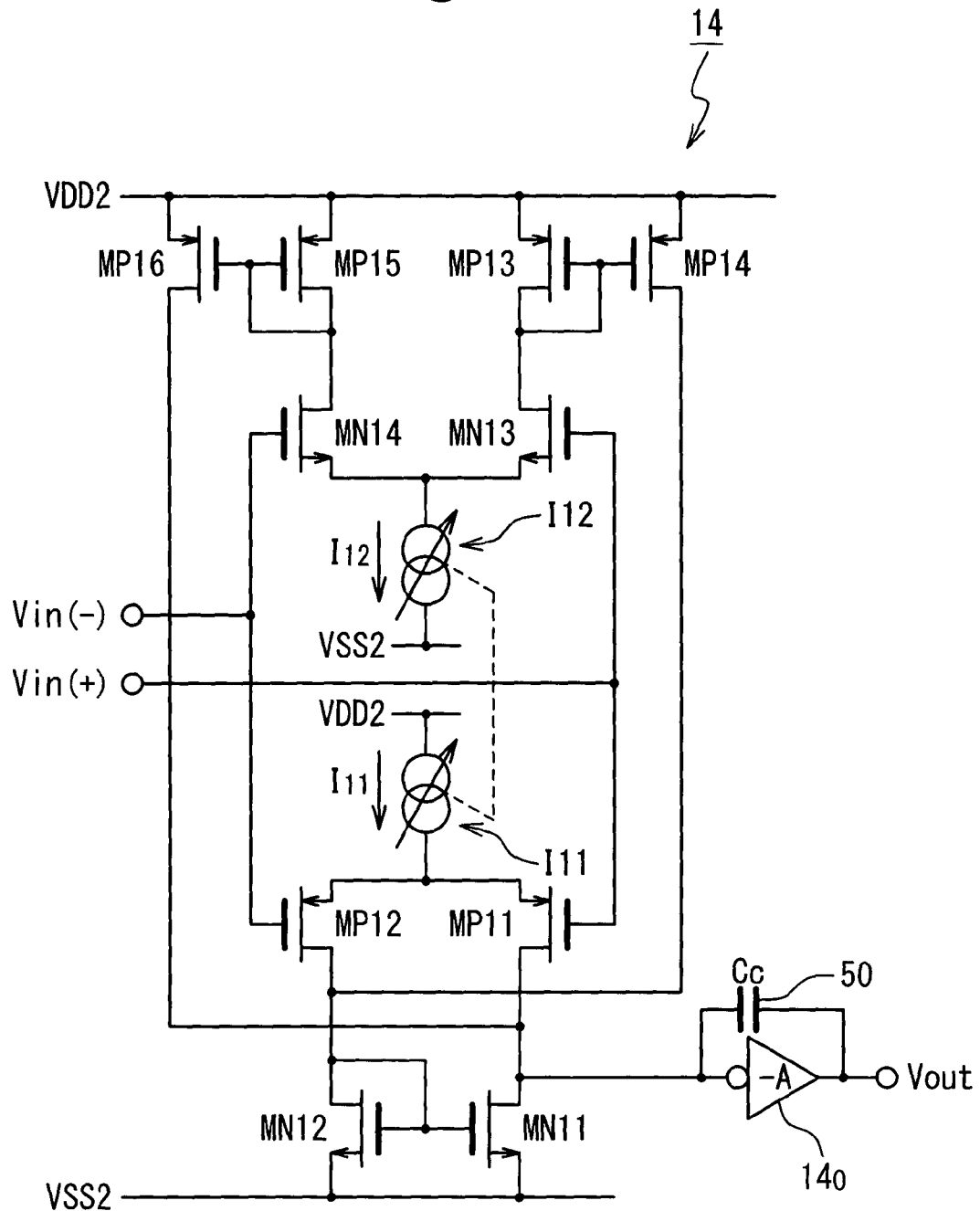
FIG. 13 is a circuit diagram showing another configuration example of an output amplifier for controlling a slew rate in the liquid crystal display device of the embodiment.

FIG. 13 is a circuit diagram showing another configuration example of the output amplifier for controlling the slew rate.

As shown in FIG. 13, a Rail-to-Rail amplifier can also be used as the output amplifier 14. The output amplifier 14 shown in FIG. 13 further includes N-channel MOS transistors MN13 and MN14, P-channel MOS transistors MP13 and MP14, P-channel MOS transistors MP15 and MP16, and a variable constant current supply I12 in addition to the circuit shown in FIG. 12. The P-channel MOS transistors MP11 and MP12, the N-channel MOS transistors MN11 and MN12, the variable constant current supply I11, the inverting amplifier (-A) 14$_0$, and the phase compensation capacitance 50 (capacitance value: Cc) are connected in the same way as shown in FIG. 12 and will be explained in no more details.

The sources of the N-channel MOS transistors MN13 and MN14 are connected in common, forming a differential stage. The P-channel MOS transistors MP13 and MP14 form a current mirror circuit. Also, the P-channel MOS transistors MP15 and MP16 form a current mirror circuit. As for the current mirror circuit that includes the P-channel MOS transistors MP13 and MP14, the input side is connected to the drain of the N-channel MOS transistor MN13, and the output side is connected to the drain of the N-channel MOS transistor MN12.

As for the current mirror circuit that includes the P-channel MOS transistors MP15 and MP16 on the other hand, the input side is connected to the drain of the N-channel MOS transistor MN14, and the output side is connected to the drain of the N-channel MOS transistor MN11. That is to say, the drain outputs of the N-channel MOS transistors MN13 and MN14 that form the differential stage are connected to the input nodes of the current mirror circuits that include the P-channel MOS transistors MP13 and MP14 and the P-channel MOS transistors MP15 and MP16 respectively. The drains of the MOS transistors MP14 and MP16, which correspond to the output nodes of the respective current mirror circuits, are connected in common to the input and output of the current mirror circuit that includes the N-channel MOS transistors MN11 and MN12. In addition, the variable constant current supply I12 is provided between a negative power supply VSS2 and the sources of the differential stage connected in common. A current value of the variable constant current supply I12 is controllable.

Current addition is performed to the N-channel MOS differential stage (MN13 and MN14) added in FIG. 13, by the current mirror circuit (MN11 and MN12) that functions as active load of the P-channel MOS differential stage (MP11 and MP12). Consequently, a signal of the N-channel MOS differential stage (MN13 and MN14) and a signal of the P-channel MOS differential stage (MP11 and MP12) are added into a single signal, which is outputted to the drain of the N-channel MOS transistor MN11.

Here, when an input voltage is the voltage near the negative power supply, only the P-channel MOS differential stage (MP11 and MP12) operates and the N-channel MOS differential stage (MN13 and MN14) does not operate. On the other hand, when the input voltage is the voltage near the positive power supply, only the N-channel MOS differential stage (MN13 and MN14) operates and the P-channel MOS differential stage (MP11 and MP12) does not operate. When the input voltage is within a range from the voltage near the positive power supply to the voltage near the negative power supply, both the N-channel MOS differential stage (MN13 and MN14) and the P-channel MOS differential stage (MP11 and MP12) operate. Therefore, the operation is possible with an entire input voltage range from approximately the negative power supply VSS (VSS2) to approximately the positive power supply VDD (VDD2). That is, a Rail-to-Rail amplifier can be achieved. As is the case with the output amplifier shown in FIG. 12, a slew rate can be controlled by controlling a current value of the variable constant current supply I11 and that of the variable constant current supply I12. As seen from the above formula (1), a slew rate is increased and decreased as the current values $I_{11}$ and $I_{12}$ are increased and decreased, respectively.

As shown in FIG. 11, the frequency divider 241 receives an STB signal (data latch pulse) or a horizontal synchronizing signal (Hsync) outputted from the control circuit 2, and outputs a divided signal to the counter 242. The frequency divider 241 has a frequency division ratio of 1/N. The value N of the frequency division ratio is set based on a resolution of a variable slew rate, the number of the gate lines 6 of the liquid crystal panel 1, and so forth. The setting will be described later. FIG. 14 is a timing chart showing the STB signal and examples of output waveforms of the frequency divider 241. In FIG. 14, (a) shows a waveform of the STB signal, (b) to (d) show output waveforms of the frequency dividing of two (2), four (4), and eight (8), respectively.

The counter 242 is a binary counter that counts the pulse number of an output signal of the frequency divider 241 inputted to a CLK input node. A count value of the counter 242 is outputted to the current-output-type digital-analog converter 243. Based on the count value, the slew rate of the output amplifier 14 is set. The count value is reset by the start pulse signal VSP of the gate driver 5 inputted to a reset input node. A vertical synchronizing signal (Vsync) may be inputted to the reset input node for reset.

The counter 242 is reset by the VSP signal that indicates that the first line of the gate driver 5 is driven, and counting up is conducted as a drive line of the gate line 6 moves. A drive line of the gate line 6 is countable with the STB signal. Here however, counting up is not conducted every time a drive line of the gate line 6 changes, due to the presence of the frequency divider 241. Counting up is conducted each time drive lines move. Here, the number of the drive lines is indicated by the frequency division ratio. Although the explanation has been given above for each of the frequency divider 241 and the counter 242, it is also possible to input the STB signal directly to the counter and only the higher-order bits of the counter are outputted to the current-output-type digital-analog converter 243. Further, an output of the counter may be converted into a control value by using a conversion chart and so on.

Figures 15A, 15B:
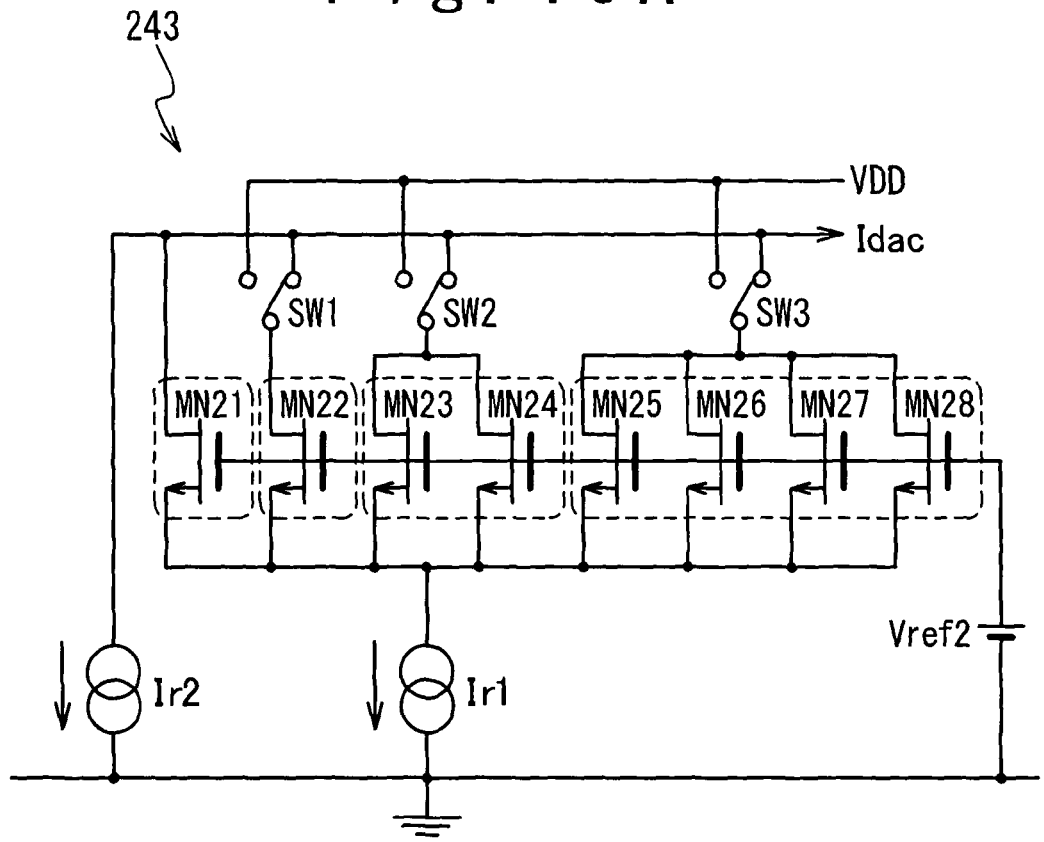
FIG. 15A is a circuit diagram showing an example of a current-output-type digital-analog converter of the embodiment.
FIG. 15B is a table showing a relation between states of current switches and current values of the current-output-type digital-analog converter of the embodiment.

The current-output-type digital-analog converter 243 is a digital-analog converter that converts a count value of the counter 242, which is a digital signal, into current of an analog signal and outputs the current to the bias control circuit 244. FIG. 15A is a circuit diagram showing an example of a 3-bit current-output-type digital-analog converter. As shown in FIG. 15A, the current-output-type digital-analog converter 243 includes eight N-channel MOS transistors MN21 to MN28, three current switches SW1 to SW3, constant current supplies Ir1 and Ir2, and a constant voltage supply Vref2. The gates of the N-channel MOS transistors MN21 to MN28 are connected in common and the sources thereof are connected in common. The sources connected in common are grounded through the constant current supply Ir1. The constant voltage supply Vref2 is connected to the gates connected in common and biases each of the gates. The constant current supply Ir2 is provided between a current output node Idac and ground (GND). Nodes on the make-side of the current switches SW1, SW2 and SW3 are connected to the current output node Idac. Nodes on the break-side of the current switches SW1, SW2 and SW3 are connected to a positive power supply VDD. A common node of the current switch SW1 is connected to the drain of the N-channel MOS transistor MN22. A common node of the current switch SW2 is connected to the drains of the N-channel MOS transistors MN23 and MN24. A common node of the current switch SW3 is connected to the drains of the N-channel MOS transistors MN25 to MN28. The drain of the N-channel MOS transistor MN21 is connected to the current output node Idac.

The current-output-type digital-analog converter shown in FIG. 15A is one known from the past that uses transistor weighting and originally includes bipolar transistors which are replaced by MOS transistors in FIG. 15A. When the current-output-type digital-analog converter is composed of bipolar transistors, since a bipolar transistor causes an error corresponding to a base current, it is necessary to add a circuit that compensates the error. On the other hand, when the current-output-type digital-analog converter is composed of MOS transistors, since a gate current equivalent to the base current can be regarded as approximately 0 and a drain current is equal to a source current, a circuit configuration is simple. The eight N-channel MOS transistors MN21 to MN28 all have the same W/L size and the respective gates and sources are connected in common. Therefore, the same current flows through all the N-channel MOS transistors MN21 to MN28. The N-channel MOS transistors MN21 to MN28 all operate with the gates being grounded. For this reason, the sum of source currents is a current value $I_{r1}$ of the constant current supply Ir1. Therefore, a source current Is of a single N-channel MOS transistor is as follows: Is=$I_{r1}$/8. That is to say, currents of $I_{r1}$/8, 2$I_{r1}$/8, 4$I_{r1}$/8 flow through the current switches SW1, SW2, and SW3, respectively. FIG. 15B is a table showing a relation between states of the current switches and the current values of a current-output-type digital-analog converter. Based on the states of the current switches SW1 to SW3, eight kinds of current values are obtained for currents flowing through the current output node Idac, as shown in FIG. 15B. In FIG. 15B, "L" and "H" indicate that a switch is set on the break-side and the make-side, respectively.

For example, an output current is as follows when the current switches SW1 to SW3 are all set on the make-side (all set in "H" states): Idac=$I_{r1}$+$I_{r2}$. On the other hand, an output current is as follows when the current switches SW1 to SW3 are all set on the break-side (all set in "L" states): Idac=$I_{r1}$/8+$I_{r2}$.

Figure 16:
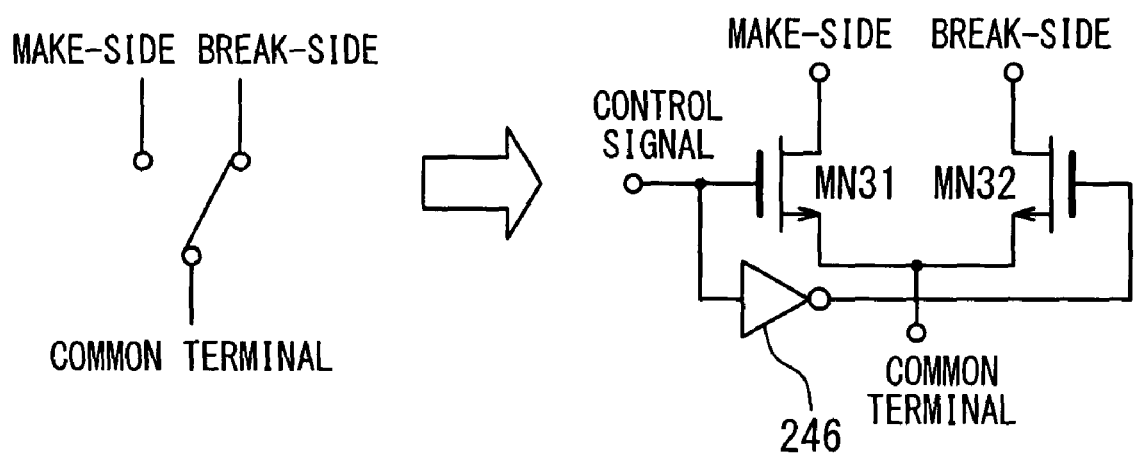
FIG. 16 is a circuit diagram showing a configuration example of the current switch using MOS transistors of the embodiment.

FIG. 16 is a circuit diagram showing a configuration example of the current switch using MOS transistors. A current switch includes two N-channel MOS transistors MN31 and MN32, and an inverter circuit 246. The sources of the N-channel MOS transistors MN31 and MN32 are connected in common, the node serving as a common node of the current switch. A control node, to which a control signal is inputted, is connected to the gate of the N-channel MOS transistor MN31 of which drain is a node on the make-side, and the input of the inverter circuit 246. The output of the inverter circuit 246 is connected to the gate of the N-channel MOS transistor MN32 of which drain is a node on the break-side.

When a control signal is low level (L), the N-channel MOS transistor MN31 takes the off state since the gate thereof is low level. On the other hand, the N-channel MOS transistor MN32 takes the on state since the gate thereof is high level. Therefore, current connected to the common source all flows through the drain of the N-channel MOS transistor MN32. When a control signal is high level (H), the N-channel MOS transistor MN32 takes the off state since the gate thereof is low level. On the other hand, the N-channel MOS transistor MN31 takes the on state since the gate thereof is high level. Therefore, current connected to the common source all flows through the drain of the N-channel MOS transistor MN31. What needs attention here is voltages of the drain and the source. That is, for a correct operation as the current switch, the MOS transistors should be made operate in a pentode region (saturation region). For this reason, it is necessary in some cases, to correctly design a circuit such that an appropriate voltage level of a gate control signal of each MOS transistor and an appropriate voltage level (H/L) of an inverter circuit can be obtained. Here, only an example of a DA converter is shown and the detail will not be explained.

Figure 17:
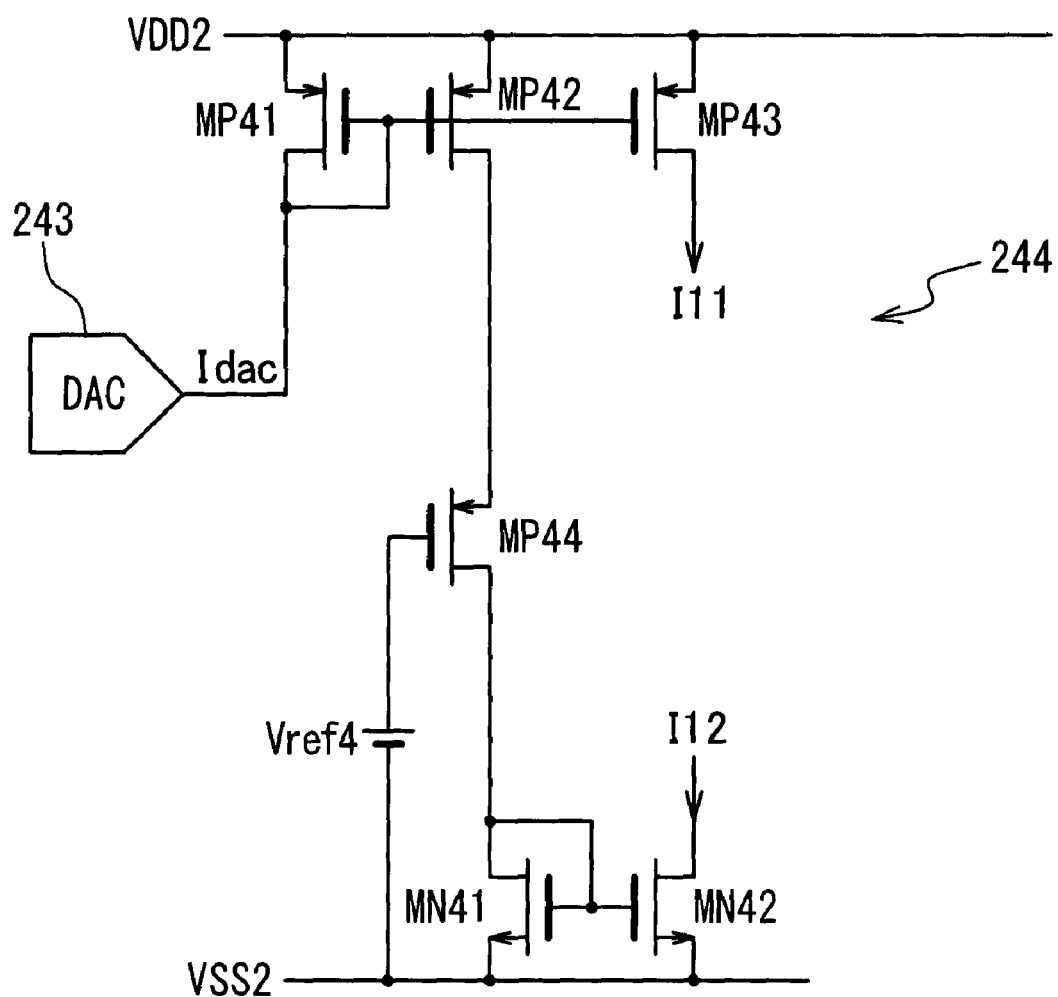
FIG. 17 is a circuit diagram showing a configuration example of a bias control circuit of the embodiment.

FIG. 17 is a circuit diagram showing a configuration example of the bias control circuit. As shown in FIG. 17, the bias control circuit 244 includes P-channel MOS transistors MP41 to MP44, N-channel MOS transistors MN41 and MN42, and a constant voltage supply Vref4. The sources of the P-channel MOS transistors MP41 to MP43 are connected in common to be connected to the positive power supply VDD2 and the gates thereof are connected in common to be connected to the drain of the P-channel MOS transistor MP41, thereby forming a current mirror circuit. The drain of the P-channel MOS transistor MP41 is connected with an output Idac of the current-output-type digital-analog converter 243, being supplied with an input current of the current mirror circuit. The drain of the P-channel MOS transistor MP43, which serves as a source-type current supply output node of the current mirror circuit, is connected to the variable constant current supply I11 of the output amplifier 14 (see FIG. 13).

The drain of the P-channel MOS transistor MP42, which serves as another source-type current supply output node of the current mirror circuit, is connected to the source of the P-channel MOS transistor MP44. The gate and drain of the P-channel MOS transistor MP44 are connected to the constant voltage supply Vref4 and the drain of the N-channel MOS transistor MN41, respectively. The sources of the N-channel MOS transistors MN41 and MN42 connected in common are connected to the negative power supply VSS2. The gate and drain of the N-channel MOS transistor MN41 are connected in common to the gate of the N-channel MOS transistor MN42 and further connected to the drain of the P-channel MOS transistor MP44. The N-channel MOS transistors MN41 and MN42 form a current mirror circuit, and the drain of the N-channel MOS transistor MN42, which serves as a sink-type output node, is connected to the variable constant current supply I12 of the output amplifier 14 (see FIG. 13).

The P-channel MOS transistors MP41 to MP43 can be seen as a two-output type current mirror circuit. That is, a node where the gate and drain of the P-channel MOS transistor MP41 are connected in common, serves as an input node of the current mirror circuit while the drains of the P-channel MOS transistors MP42 and MP43 serve as two output nodes of the current mirror circuit. As the characteristic of current mirror circuits, a current with the same current value as one inputted to the P-channel MOS transistor MP41 is outputted from the drains of the P-channel MOS transistors MP42 and MP43.

A drain current of the P-channel MOS transistor MP42 is inputted to the source of the P-channel MOS transistor MP44, of which gate biased by the constant voltage supply Vref4 is grounded, and is outputted from the drain of the P-channel MOS transistor MP44 with an increase in output impedance. A drain current of the P-channel MOS transistor MP44 flows into the input of the current mirror circuit that includes the N-channel MOS transistors MN41 and MN42. Therefore, a current with the same current value as the drain current of the P-channel MOS transistor MP44 is outputted to the drain of the N-channel MOS transistor MN42, which is the output of the current mirror circuit. In this way, it is possible to achieve source-type and sink-type constant current supplies having the same current value as current inputted to the P-channel MOS transistor MP41. Consequently, current values of the variable constant current supplies I11 and I12 for controlling a slew rate of the output amplifier 14 are set in conjunction with each other, by the current generated by the current-output-type digital-analog converter 243.

Next, an operation of the output circuit 13 of which slew rate is controlled will be explained below.

As shown in FIG. 11, the counter 242 is supplied with a strobe signal (STB) to which N frequency dividing is carried out by the frequency divider 241, as a count input. The STB signal is inputted to the frequency divider 241 every time the gate driver 5 drives a gate line. It is possible to know which line the gate driver 5 drives by counting how many times the STB signal has taken high level since the start pulse (VSP) was inputted. When the STB signal takes high level for the first time after the start pulse (VSP) takes high level, the gate driver 5 drives the first line. When the STB signal takes high level for the next time, the gate driver 5 drives the second line. In this way, a drive line can easily be known by counting the number of times when the STB signal takes high level. At this time, it is not necessarily to make a resolution of the current-output-type digital-analog converter 243 correspond to the number of lines to be driven. The number of lines in a liquid crystal panel is for example, 1024 lines in the case of a SXGA (Super extended Graphics Array) panel, which is equivalent to 10 bits when a resolution corresponds thereto. However, when the slew rate of the output amplifier 14 are set to be varied to eight stage, it is just necessary to set eight kinds of current values for a bias current. Therefore, the current-output-type digital-analog converter 243 just needs to have a 3-bit resolution. When 1024 lines of an SXGA panel are driven at eight kinds of slew rates, a current value should be increased every 128 lines, which is 1024 divided by 8. That is, it is enough to be 1/128 as a frequency division ratio of the frequency divider 241. When the number of lines in the liquid panel 1 is n, the frequency divider 241 outputs a pulse every n/8 lines, which is counted up by the counter 242. In this way, a frequency division ratio of the frequency divider 241 and a resolution of the current-output-type digital-analog converter 243 are determined.

Figure 18:
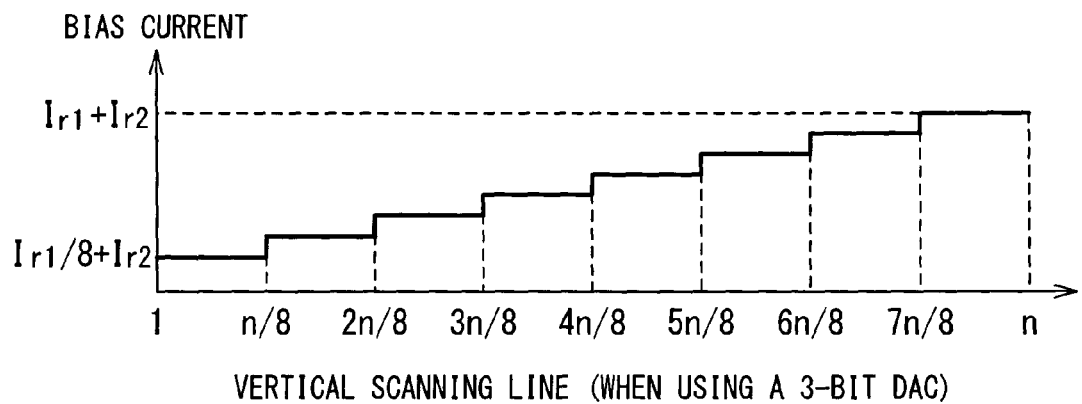
FIG. 18 is a graph showing a driving example for the bias control circuit of the embodiment.

FIG. 18 is a graph showing a driving example for the bias control circuit. A count value of the counter 242 is cleared by the start pulse (VSP signal) of the gate driver 5, thereby knowing that the gate driver 5 drives the gate line $6_1$, which is the first line. Since a count value of the counter 242 is cleared, an output of the current-output-type digital-analog converter 243 at this time is $I_{r1}/8+I_{r2}$ as shown in FIG. 18. The bias control circuit 244 sets this current value to the variable constant current supplies I11 and I12 of the output amplifier 14, and the output amplifier 14 operates at the minimum slew rate.

The counter 242 does not change its condition from the first line to the n/8 line. When the n/8+one line is driven, the counter 242 performs counting up and the current-output-type digital-analog converter 243 outputs an output current value that has been increased to $2I_{r1}/8+I_{r2}$. The bias control circuit 244 sets this current value to the variable constant current supplies I11 and I12 of the output amplifier 14, and the output amplifier 14 operates with an increase in the slew rate. As a vertical scanning line shifts from the 2n/8+one line to the 3n/8 line, the 3n/8+one line to the 4n/8 line, . . . , and the 7n/8+one line to the n-th line as shown in FIG. 18, an output current of the current-output-type digital-analog converter 243 increases and the output amplifier 14 operates with an increase in the slew rate every stage. The slew rate reaches the maximum from the 7n/8+one line to the nth line, and driving waveforms get steep as shown in FIG. 10C.

As explained above, it is possible to reduce power consumption of the output amplifier 14 while maintaining conventional driving power, by changing a slew rate of the output amplifier 14 based on positions of the gate line 6 which the gate driver 5 drives. By appropriately setting current values of the constant current supplies Ir1 and Ir2, an optimum slew rate can be set for each drive line. As a result, low power consumption is possible and an expensive source driver tape of low thermal resistance does not need to be used. At the same time, heat release parts of a semiconductor chip and so on, are unnecessary. Consequently, reduction in costs is also possible.

The description was given above, of the circuit that controls a bias current of an amplifier for the purpose of changing a slew rate of an output circuit. As understood from the above formula (1), a slew rate of an amplifier is determined by a bias current through the first stage and a phase compensation capacitance. Description will be given below, concerning a circuit where a slew rate is controlled by changing a phase compensation capacitance.

Figure 19:
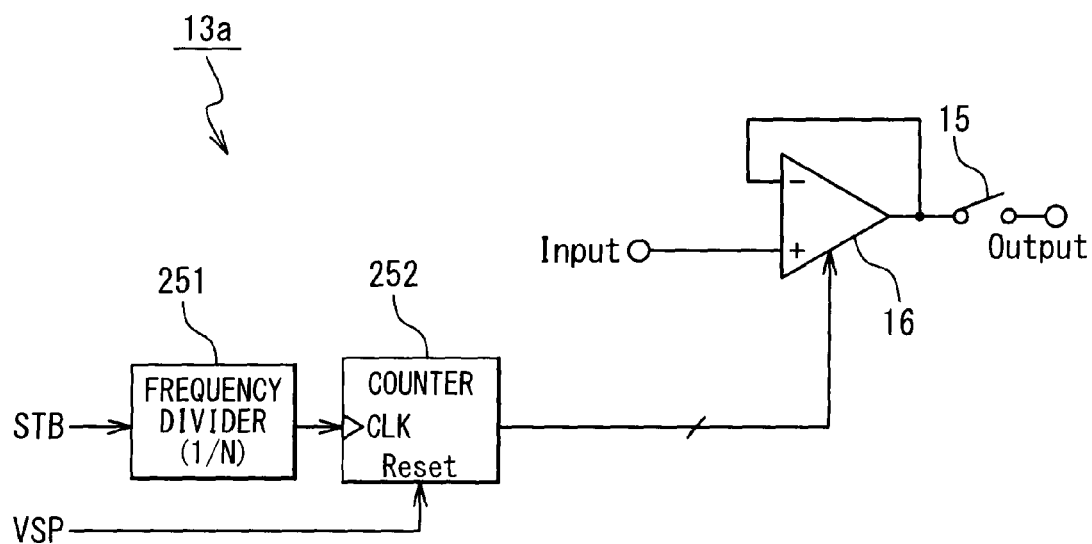
FIG. 19 is a block diagram showing another configuration example of an output circuit in the liquid crystal display device of the embodiment.

FIG. 19 is a block diagram showing a configuration of an output circuit 13a where a slew rate is controlled by changing a phase compensation capacitance. The output circuit 13a includes an output amplifier 16, a frequency divider 251, a counter 252, and a switch 15. The switch 15 is connected between a load and an output of the output amplifier 16 and controls timing of load driving. The frequency divider 251 to which the STB signal is supplied, carries out N frequency dividing to the STB signal and outputs the divided signal to the counter 252. The counter 252 counts an output of the frequency divider 251 and supplies a count value to the output amplifier 16. Compared with the case of the output circuit mentioned above with reference to FIG. 11, the current-output-type digital-analog converter 243 and the bias control circuit 244 are not provided and output of the counter 252 is supplied to the output amplifier 16. Since the frequency divider 251 and the counter 252 operate in the same way as the frequency divider 241 and the counter 242, respectively, the detailed explanation thereof will be omitted.

Figure 20:
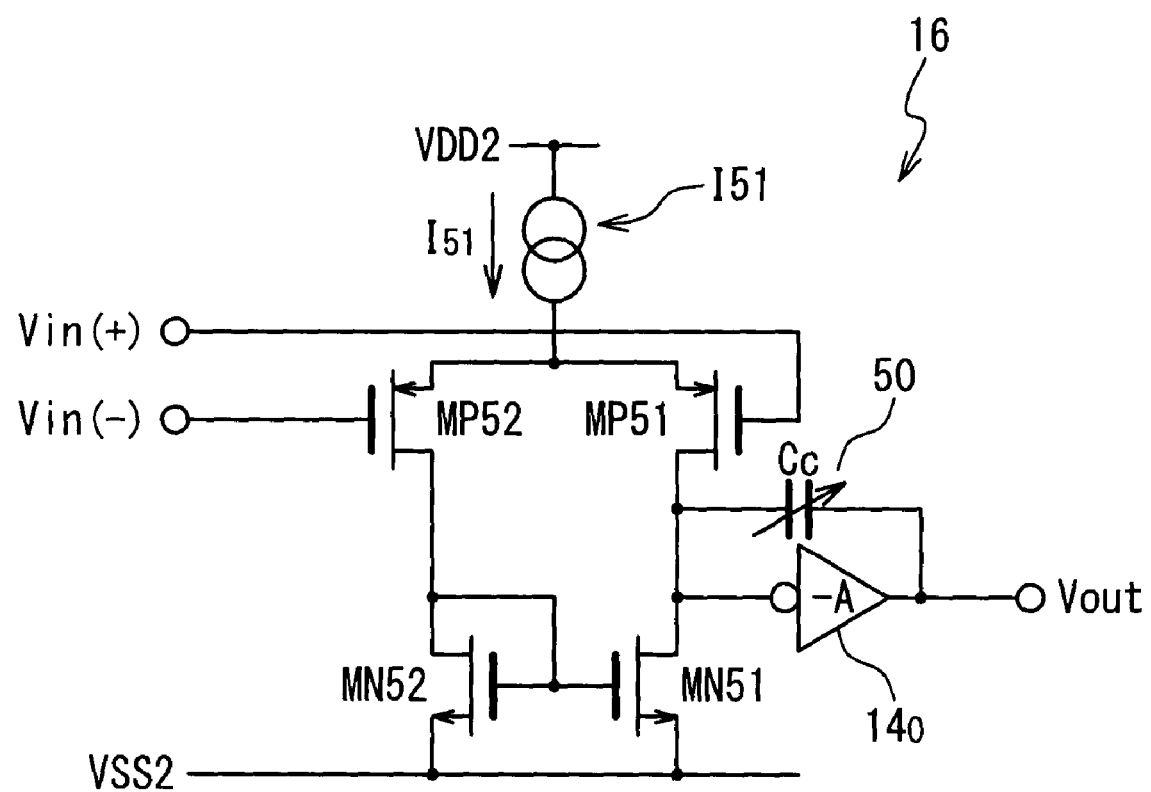
FIG. 20 is a circuit diagram showing another configuration example of an output amplifier for controlling a slew rate in the liquid crystal display device of the embodiment.

FIG. 20 is a circuit diagram showing another configuration example of an output amplifier for controlling a slew rate. As shown in FIG. 20, the output amplifier 16 includes P-channel MOS transistors MP51 and MP52, N-channel MOS transistors MN51 and MN52, a constant current supply I51, an inverting amplifier (−A) $14_0$, and a phase compensation capacitance 50. The sources of the P-channel MOS transistors MP51 and MP52 forming a differential stage are connected in common and connected to the constant current supply I51. The drains of the N-channel MOS transistors MN51 and MN52 are connected to the drains of the P-channel MOS transistors MP51 and MP52, respectively, and the sources of the N-channel MOS transistors MN51 and MN52 are connected to a power supply VSS2. The constant current supply I51 is provided between the sources of the differential stage connected in common and a positive power supply VDD2 and supplies a current $I_{51}$ to the differential stage. The inverting amplifier $14_0$ receives a signal that is generated from an output of the differential stage as a result of single conversion, and amplifies the signal to output an output Vout. The phase compensation capacitance 50 is connected between the input and output of the inverting amplifier $14_0$, and a capacitance value of the phase compensation capacitance 50 is controlled to vary. A slew rate changes in response to the capacitance value of the phase compensation capacitance 50. Since operation excluding the above is the same as the output amplifier 14 shown in FIG. 12, further explanation will be omitted.

Figures 21A, 21B:
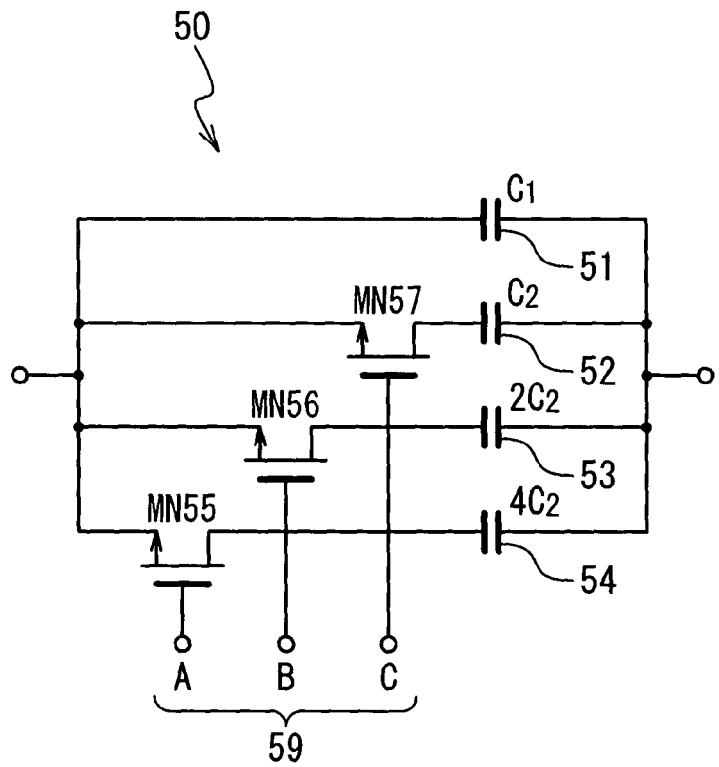
FIG. 21A is a circuit diagram showing a configuration example of a phase compensation capacitance of the embodiment.
FIG. 21B is a table showing a relation between states of count values and capacitance values of the phase compensation capacitance of the embodiment.

FIG. 21A is a circuit diagram showing a configuration example of a phase compensation capacitance. As shown in FIG. 21A, the phase compensation capacitance 50 includes N-channel MOS transistors MN55 to MN57 and capacitive elements 51 to 54. The N-channel MOS transistors MN55, MN56, and MN57 are connected in series to the capacitive elements 54, 53, and 52, respectively, functioning as a switch. The gates of the N-channel MOS transistors MN55, MN56, and MN57 are connected to control nodes 59. The output of the counter 252 is connected to the control nodes 59. That is, the control node receives the count value from the counter 252. The switches (the N-channel MOS transistors MN55, MN56, and MN57) are switched on and off based on the count value.

FIG. 21B is a table showing a relation between states of the count values and the capacitance values of the phase compensation capacitance. The capacitive elements 51, 52, 53 and 54 have capacitances of capacitance values $C_1$, $C_2$, 2 times $C_2$, and 3 times $C_2$, respectively. As shown in FIG. 21B therefore, the phase compensation capacitance 50 can change a capacitance value such as $C_1$, $C_1+C_2$, $C_1+2C_2$, ..., and $C_1+7C_2$, based on the count values of the counter 252. Since the counter 252 is explained as a 3-bit binary counter here, there are eight kinds of capacitance values. However, the bit number is not limited to three. In this way, a slew rate of the output amplifier 16 can be controlled by making the phase compensation capacitance 50 variable.

FIG. 22 is a graph showing waveforms when the liquid crystal panel is driven with the circuit configuration mentioned above. In FIG. 22, (a) shows an STB signal, where the position of a drive line of the gate driver 5 can be identified by counting a rising edge of the STB signal. In FIG. 22, (b) shows polarities of a signal driven by the source driver 4. The polarities of the signal change to each other alternately every 1 H period. In FIG. 22, (c) to (e) show waveforms (solid lines) at a load near end of the signals driven by the source driver 4 and actual waveforms (broken lines) at a position of a drive line. Change of slew rates causes a rising edge (falling edge) of a waveform to vary at the output position of the source driver 4 but causes a similar rising edge (falling edge) for a waveform at the position of a drive line, namely, a write waveform of a pixel capacitance of the liquid crystal panel. Controlling a slew rate makes it possible to cause write waveforms of pixel capacitances to have similar rising edges (falling edges) in all drive lines, thereby achieving uniform image quality.

As explained above, it is possible to set an optimum slew rate for each drive line and achieve low power consumption by using a source driver that controls a slew rate in an LCD module. Consequently, an expensive source driver tape of low thermal resistance is unnecessary or heat release parts of a chip are unnecessary, making it possible to reduce costs.

According to the present invention, it is possible to provide a capacitive load driving circuit and a capacitive load driving method for reducing power consumption while maintaining conventional driving power.

According to the present invention, an optimum slew rate can be set for each drive line, making it possible to reduce power consumption. According to the present invention, an expensive source driver tape of low thermal resistance is unnecessary or heat release parts of a semiconductor chip and so on are unnecessary, making it possible to reduce costs.

It is apparent that the present invention is not limited to the above embodiment, but may be modified and changed without departing from the scope and spirit of the invention.

What is claimed is:

1. A capacitive load driving circuit comprising:
a gate driver configured to drive a plurality of capacitive loads, arranged in a matrix form, in a row direction; and
a source driver configured to drive said plurality of capacitive loads in a column direction,
wherein said source driver includes:
a plurality of output circuits configured to be arranged in a row direction,
wherein each of said plurality of output circuits changes a slew rate based on a column position along the column direction of a capacitive load of said plurality of capacitive loads,
wherein said each of said plurality of output circuits includes:
a counter configured to count said column position of said capacitive load, and
wherein said each output circuit controls said slew rate based on a count value of said counter.

2. The capacitive load driving circuit according to claim 1, wherein said counter is reset by one of a start pulse indicating a start position of said column position of said capacitive load and a vertical synchronizing signal, and
said counter counts one of a data latch pulse for latching data to be displayed and a horizontal synchronizing signal.

3. A capacitive load driving circuit, comprising:
a gate driver configured to drive a plurality of capacitive loads, arranged in a matrix form, in a row direction; and
a source driver configured to drive said plurality of capacitive loads in a column direction,
wherein said source driver includes:
a plurality of output circuits configured to be arranged in a row direction,
wherein each of said plurality of output circuits changes a slew rate based on a column position along the column direction of a capacitive load of said plurality of capacitive loads,
wherein said each of said plurality of output circuits includes:
an output amplifier configured to change said slew rate by controlling a bias current of a differential stage,
wherein said each output circuit further includes:
a current-output-type digital-analog converter configured to control said bias current,
wherein said each of said plurality of output circuits includes:
a counter configured to count said column position of said capacitive load,
wherein said current-output-type digital-analog converter includes:
a plurality of MOS (metal-oxide semiconductor) transistors configured to be connected to each other with gates thereof in common and be connected to each other with sources thereof in common,
a constant voltage supply configured to bias said gates thereof,
a first constant current supply configured to be arranged between said sources thereof and a first power supply,
a second constant current supply configured to be arranged between a current output node and said first power supply, and
a plurality of current switches configured to connect one of a second power supply and said current output node to corresponding one of drains of said plurality of MOS transistors, and wherein said current-output-type digital-analog converter controls an output current by switching on or off said plurality of current switches based on a count value of said counter.

4. A capacitive load driving circuit comprising:
a gate driver configured to drive a plurality of capacitive loads, arranged in a matrix form in a row direction; and
a source driver configured to drive said plurality, of capacitive loads in a column direction,
wherein said source driver includes:
   a plurality of output circuits configured to be arranged in a row direction, wherein each of said plurality of output circuits changes a slew rote based on a column position along the column direction of a capacitive load of said plurality of capacitive loads,
      wherein each of said plurality of output circuits includes:
      an output amplifier configured to have a phase compensation capacitance connected between an input node and an output node,
      wherein said output amplifier changes said slew rate by controlling, a capacitive value of said phase compensation capacitance,
      wherein said phase compensation capacitance includes:
      a first capacitive element,
      a plurality of capacitive elements configured to be connected to said first capacitive element in parallel, and
      a plurality of switches configured to switch on and off capacitive values of said a plurality of capacitive elements,
      wherein said phase compensation capacitance changes said slew rate by controlling said capacitive value of said phase compensation capacitance using said plurality of switches, and
      wherein said each of said plurality of output circuits includes:
      a counter configured to count said column position of said capacitive load, and wherein said each output circuit controls said slew rate based on a count value of said counter.

5. A method of driving a capacitive load, comprising:
driving a plurality of capacitive loads arranged in a matrix form in a row direction; and
driving said plurality of capacitive loads in a column direction,
wherein said driving said plurality of capacitive loads in the column direction comprises:
   driving said plurality of capacitive loads by a plurality of output circuits arranged in a row direction; and
   changing a slew rate of each of said plurality of output circuits based on a column position in the column direction of a capacitive load of said plurality of capacitive loads,
wherein said driving said plurality of capacitive loads includes:
   making said slew rate minimum when said column position of said capacitive load is the nearest position to said each output circuit, and makes said slew rate maximum when said column position of said capacitive load is the farthest position from said each output circuit, and
wherein said driving of said plurality of capacitive loads includes:
   counting said column position of said capacitive load, and
   controlling said slew rate based on a count value in said counting of said column position.

6. The method of driving a capacitive load according to claim 5, wherein said counting of said column position includes:
   resetting said count value by one of a start pulse indicating a start position of said column position of said capacitive load and a vertical synchronizing signal, and
   counting one of a data latch pulse for latching data to be displayed and a horizontal synchronizing signal.

* * * * *